(12) United States Patent
Kim et al.

(10) Patent No.: US 12,453,194 B2
(45) Date of Patent: Oct. 21, 2025

(54) IMAGE SENSOR

(71) Applicant: SAMSUNG ELECTRONICS CO., LTD., Suwon-si (KR)

(72) Inventors: Boseong Kim, Seoul (KR); Bumsuk Kim, Hwaseong-si (KR); Hyeyeon Park, Seoul (KR); Jeongmin Bae, Suwon-si (KR); Yunki Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 594 days.

(21) Appl. No.: 17/671,794

(22) Filed: Feb. 15, 2022

(65) Prior Publication Data
US 2023/0005980 A1 Jan. 5, 2023

(30) Foreign Application Priority Data
Jul. 1, 2021 (KR) .................. 10-2021-0086573

(51) Int. Cl.
*H10F 39/00* (2025.01)
*H10F 39/18* (2025.01)
(52) U.S. Cl.
CPC ......... *H10F 39/18* (2025.01); *H10F 39/8053* (2025.01); *H10F 39/8063* (2025.01); *H10F 39/807* (2025.01); *H10F 39/811* (2025.01)
(58) Field of Classification Search
CPC ......... H01L 27/14643; H01L 27/14636; H01L 27/14621; H01L 27/14627; H01L 27/14603; H01L 27/1463
See application file for complete search history.

(56) References Cited

U.S. PATENT DOCUMENTS

| | | | |
|---|---|---|---|
| 8,013,928 B2 | 9/2011 | Egawa |
| 9,634,049 B2 | 4/2017 | Chang et al. |
| 9,640,576 B2 | 5/2017 | Wu et al. |
| 10,319,761 B2 | 6/2019 | Sugizaki |
| 10,341,595 B2 | 7/2019 | Jung et al. |

(Continued)

FOREIGN PATENT DOCUMENTS

| | | |
|---|---|---|
| CN | 111009534 A | 4/2020 |
| CN | 112135017 A | 12/2020 |

(Continued)

*Primary Examiner* — Joshua Benitez Rosario
*Assistant Examiner* — Moataz Khalifa
(74) *Attorney, Agent, or Firm* — Muir Patent Law, PLLC

(57) ABSTRACT

An image sensor includes: a substrate, having first and second surfaces opposing each other in a first direction, on which a plurality of unit pixels are arranged, the plurality of unit pixels including a normal pixel, an autofocusing pixel, and a compensation pixel in a direction, parallel to the first surface; a photodiode disposed in the substrate in each of the plurality of unit pixels; and a device isolation layer disposed between the plurality of unit pixels. The unit pixels include color filters, separated from each other by a grid, and microlenses disposed on the color filters. The compensation pixel is disposed on one side of the autofocusing pixel and includes a compensation microlens, smaller than a normal microlens included in the normal pixel, and a transparent color filter separated from adjacent color filters by a compensation grid smaller than a normal grid included in the normal pixel.

20 Claims, 25 Drawing Sheets

(56) References Cited

U.S. PATENT DOCUMENTS

| | | | |
|---|---|---|---|
| 2016/0276394 A1 | 9/2016 | Chou et al. | |
| 2017/0366770 A1* | 12/2017 | Yokogawa | H01L 27/14627 |
| 2020/0235149 A1* | 7/2020 | Shiraishi | H01L 27/14627 |
| 2021/0281750 A1* | 9/2021 | Vu | H10F 39/8063 |
| 2021/0368117 A1* | 11/2021 | Nishi | G03B 13/16 |
| 2022/0181370 A1* | 6/2022 | Lin | H01L 27/14623 |

FOREIGN PATENT DOCUMENTS

| | | | | |
|---|---|---|---|---|
| CN | 212434628 U | 1/2021 | | |
| FR | 3112425 A1 * | 1/2022 | | H01L 27/14605 |
| JP | 2020-150267 A | 9/2020 | | |
| KR | 10-2016-0000044 A | 1/2016 | | |
| KR | 10-2017-0098809 A | 8/2017 | | |
| KR | 10-2018-0026109 A | 3/2018 | | |
| KR | 10-2019-0017197 A | 2/2019 | | |
| KR | 10-2020-0014722 A | 2/2020 | | |
| TW | 202016578 A | 5/2020 | | |
| WO | 2020/012860 A1 | 1/2020 | | |

\* cited by examiner

IMAGE SENSOR

CROSS-REFERENCE TO RELATED APPLICATION

This application claims benefit of priority to Korean Patent Application No. 10-2021-0086573, filed on Jul. 1, 2021, in the Korean Intellectual Property Office, the disclosure of which is incorporated herein by reference in its entirety.

BACKGROUND

1. Field

Embodiments relate to an image sensor.

2. Description of the Related Art

An image sensor may be implemented as a semiconductor-based sensor receiving light to generate an electrical signal therefrom, and may include a pixel array having a plurality of unit pixels, circuits for driving the pixel array and generating an image, and the like. The plurality of unit pixels may include a photodiode for generating a charge in response to external light, a pixel circuit for converting the charge generated by the photodiode into an electrical signal, and the like. The image sensor may be widely applied to smartphones, tablet personal computers (PCs), laptop computers, televisions, vehicles, or the like, in addition to cameras for capturing an image or a video. Recently, research into the generation of images having high image quality as well as research into improvements of autofocusing performance has been conducted.

SUMMARY

According to an embodiment, an image sensor includes: a substrate, having a first surface and a second surface opposing each other in a first direction, on which a plurality of unit pixels are arranged, the plurality of unit pixels including at least one normal pixel, at least one autofocusing pixel, and at least one compensation pixel arranged parallel to the first surface; a photodiode disposed in the substrate in each of the plurality of unit pixels; and a device isolation layer disposed between the plurality of unit pixels, wherein: the plurality of unit pixels includes color filters, disposed on the first surface and separated from each other by a grid, and microlenses disposed on the color filters, the normal pixel includes a normal microlens, and the compensation pixel is disposed on one side of the autofocusing pixel and includes a transparent color filter and a compensation microlens, which is smaller than the normal microlens.

According to an embodiment, an image sensor includes: a substrate; a pixel array including a plurality of pixel groups arranged parallel to an upper surface of the substrate; and a logic circuit configured to obtain pixel signals from the pixel array, wherein: each of the plurality of pixel groups includes a plurality of unit pixels forming at least one of an autofocusing pixel, a compensation pixel, and a normal pixel, which are respectively defined by a device isolation layer extending in a first direction, perpendicular to the upper surface of the substrate, each unit pixel includes: a photodiode disposed in the substrate; a color filter disposed on the upper surface of the substrate and separated from an adjacent color filter by a grid; and a microlens disposed on the color filter, the autofocusing pixel includes a pair of unit pixels, and the compensation pixel is configured to compensate for a signal output from the autofocusing pixel, and includes a compensation microlens, smaller than the microlens included in adjacent pixels, and a transparent color filter.

According to an embodiment, an image sensor includes: a substrate, having a first surface and a second surface opposing each other in a first direction; unit pixels on the first surface; a photodiode in the substrate in each of the unit pixels; and a device isolation layer between the unit pixels, wherein: the unit pixels form an autofocusing pixel, a normal pixel, and a compensation pixel, each unit pixel has a color filter, which is separated from an adjacent color filter by a grid, and a microlens on the color filter, the autofocusing pixel includes a pair of unit pixels disposed side by side in a second direction and sharing a microlens and a color filter, and the compensation pixel is configured to compensate for a signal output from the autofocusing pixel, has a structure different from a structure of the normal pixel, is disposed on one side of the autofocusing pixel in the second direction, and includes a transparent color filter.

BRIEF DESCRIPTION OF DRAWINGS

Features will become apparent to those of skill in the art by describing in detail example embodiments with reference to the attached drawings in which.

DETAILED DESCRIPTION

Figure 1:
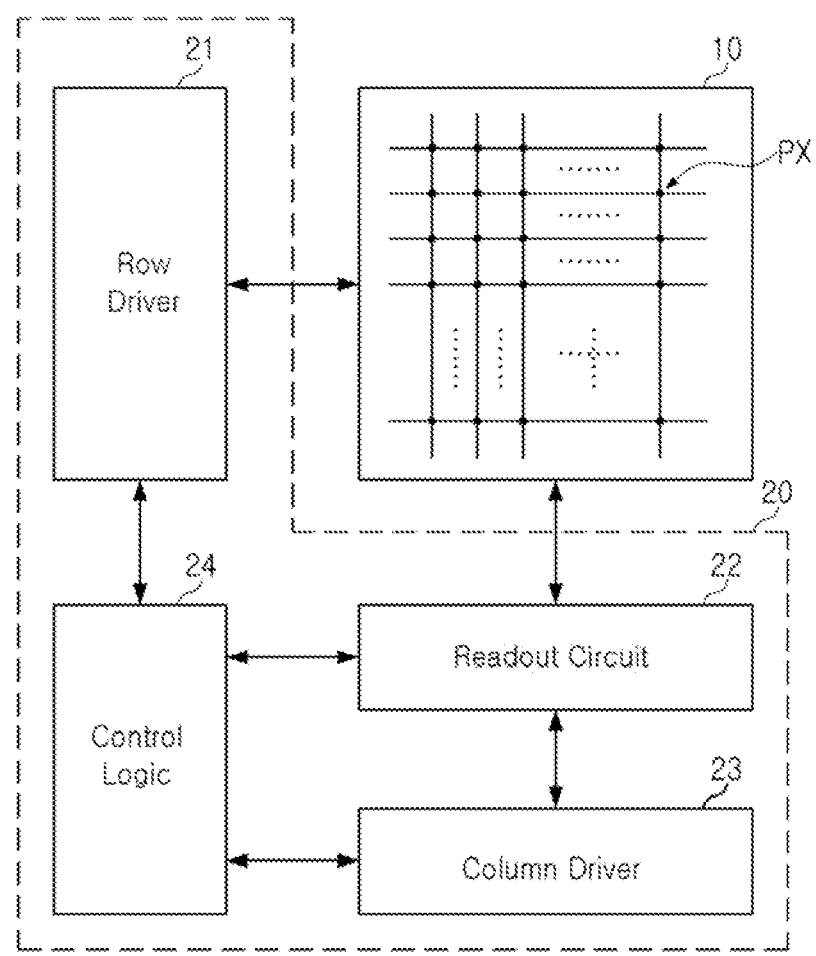
FIG. 1 is a schematic block diagram of an image sensor according to an example embodiment.

FIG. 1 is a schematic block diagram of an image sensor according to an example embodiment.

Referring to FIG. 1, an image sensor 1 according to an example embodiment may include a pixel array 10, a logic circuit 20, and the like.

The pixel array 10 may include a plurality of unit pixels PX arranged in an array of a plurality of rows and a plurality of columns. Each of the unit pixels PX may include at least one photoelectric conversion element for generating a charge in response to light, and a pixel circuit for generating a pixel signal that corresponds to the charge generated by the photoelectric conversion element.

The photoelectric conversion element may include a photodiode formed of a semiconductor material, and/or an organic photodiode formed of an organic material. Each of the unit pixels PX may include a single photoelectric conversion element, and a photoelectric conversion element included in a unit pixel PX may receive light to generate charges.

The plurality of unit pixels PX may include at least one normal pixel, at least one autofocusing pixel, and at least one compensation pixel. Each of the normal pixel, the autofocusing pixel, and the compensation pixel may include a photodiode receiving light to generate charges.

The autofocusing pixel may be a pixel allowing the image sensor 1 to perform an autofocusing function.

The compensation pixel may be a pixel for preventing crosstalk which may occur in the autofocusing pixel.

Each of the plurality of unit pixels PX included in the image sensor 1 may include a photodiode. When each of the unit pixels PX includes a single photoelectric conversion element, each of the unit pixels PX may include a pixel circuit for processing charges generated by the photoelectric conversion element. The pixel circuit may include a transmission transistor, a driving transistor, a select transistor, and a reset transistor. Accordingly, a pixel circuit corresponding to each of the unit pixels PX may include a transmission transistor, a driving transistor, a select transistor, and a reset transistor.

In another implementation, the plurality of unit pixels PX included in the image sensor 1 may share a floating diffusion region in units of pixel groups or smaller units. Accordingly, at least some of the photoelectric conversion elements may share some of the driving transistors, the select transistor, and the reset transistor.

The logic circuit 20 may include circuits for controlling the pixel array 10. As an example, the logic circuit 20 may include a row driver 21, a readout circuit 22, a column driver 23, a control logic 24, and the like.

The row driver 21 may drive the pixel array 10 in units of rows. As an example, the row driver 21 may generate a transmission control signal controlling a transmission transistor of the pixel circuit, a reset control signal controlling the reset transistor, a select control signal controlling the select transistor, or the like, and may input the generated signal to the pixel array 10 in units of rows.

The readout circuit 22 may include a correlated double sampler (CDS), an analog-to-digital converter (ADC), and the like. The correlated double samplers may be connected to the unit pixels PX through column lines. The correlated double samplers may receive pixel signals from unit pixels PX, connected to a row line selected by a row line select signal of the row driver 21, to perform correlated double sampling. The pixel signal may be received via the column lines. The analog-to-digital converter may convert the pixel signal, detected by the correlated double sampler, into a digital pixel signal and may transmit the digital pixel signal to the column driver 23.

The column driver 23 may include a latch or buffer circuit in which a digital pixel signal may temporarily stored, an amplifier circuit, and the like, and may process a digital pixel signal received from the readout circuit 22. The row driver 21, the readout circuit 22, and the column driver 23 may be controlled by the control logic 24. The control logic 24 may include a timing controller for controlling operation timings of the row driver 21, the readout circuit 22, and the column driver 23, and the like.

Among the unit pixels PX, unit pixels PX disposed in the same position in a horizontal direction may share the same column line. As an example, unit pixels PX disposed in the same position in a vertical direction may be simultaneously selected by the row driver 21 and may output a pixel signal through column lines. The readout circuit 22 may simultaneously obtain a pixel signal from the unit pixels PX selected by the row driver 21 through column lines. The pixel signal may include a reset voltage and a pixel voltage, and the pixel voltage may be a voltage in which charges generated in response to light in each of the unit pixels PX are reflected on the reset voltage.

In other implementations, the image sensor may further include other components and may be driven in various manners.

Figure 2:
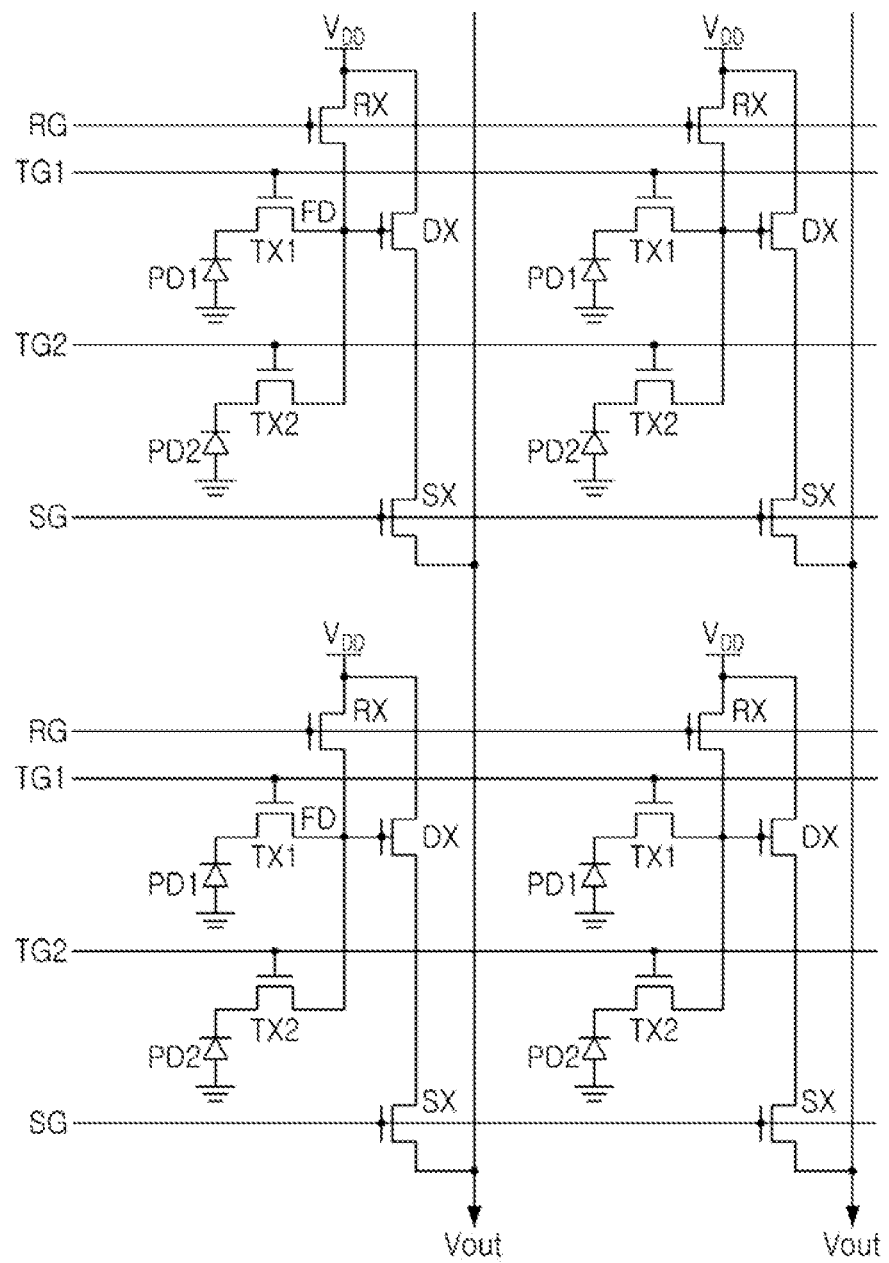
FIG. 2 is a circuit diagram of a pixel circuit of an image sensor according to an example embodiment.

FIG. 2 is a circuit diagram of a pixel circuit of an image sensor according to an example embodiment.

Referring to FIG. 2, a plurality of unit pixels PX included in an image sensor 1 according to an example embodiment may be grouped by two. A pixel circuit, corresponding to each of the grouped unit pixels PX, may include a plurality of semiconductor devices for processing charges generated by photodiodes PD1 and PD2, together with the photodiodes PD1 and PD2 corresponding to the plurality of unit pixels PX.

As an example, a pixel circuit may include first and second photodiodes PD1 and PD2, first and second transmission transistors TX1 and TX2, a reset transistor RX, a select transistor SX, and a driving transistor DX. The first and second photodiodes PD1 and PD2 included in the pixel circuit may share a floating diffusion region FD, the reset transistor RX, the select transistor SX, and the driving transistor DX. Gate electrodes of the first and second transmission transistors TX1 and TX2, the reset transistor RX, and the select transistor SX may be connected to driving signal lines TG1, TG2, RG, and SG, respectively.

In other implementations, the pixel circuit may be designed in various manners. As an example, the pixel circuit may include semiconductor devices for processing charges, generated by a photodiode, in units of the unit pixels PX.

Referring again to FIG. 2, one pixel circuit may generate a first electric signal from the charges generated by the photodiodes PD1 and PD2 and may output the first electrical signal to a first column line, and another pixel circuit may generate a second electrical signal from the charges generated by the photodiodes PD1 and PD2 and may output the second electrical signal to a second column line. Two or more pixel circuits disposed to be adjacent to each other may share a single first column line. Similarly, two or more different pixel circuits disposed to be adjacent to each other may share a single second column line. Pixel circuits disposed to be adjacent to each other may share some semiconductor devices.

The first and second transmission transistors TX1 and TX2 may be connected to the first and second transfer gates TG1 and TG2 and the first and second photodiodes PD1 and PD2, respectively. The first and second transmission transistors TX1 and TX2 may share the floating diffusion region FD. The first and second photodiodes PD1 and PD2 may generate charges in proportion to the amount of externally incident light, and may accumulate the charges in each photodiode.

The first and second transmission transistors TX1 and TX2 may sequentially transmit the charges, accumulated in the first and second photodiodes PD1 and PD2, to the floating diffusion region FD, respectively. Different signals may be applied to the first and second transfer gates TG1 and TG2 to transmit the charges, generated by one of the first and second photodiodes PD1 and PD2, to the floating diffusion region FD. Accordingly, the floating diffusion region FD may accumulate the charges generated by one of the first and second photodiodes PD1 and PD2.

The reset transistor RX may periodically reset the charges accumulated in the floating diffusion region FD. For example, electrodes of the reset transistor RX may be connected to the floating diffusion region FD and a power supply voltage VDD. When the reset transistor RX is turned on, the charges accumulated in the floating diffusion region FD may be discharged due to a potential difference from the power supply voltage VDD to reset the floating diffusion region FD and a voltage of the floating diffusion region FD may be the same as the power supply voltage VDD.

An operation of the driving transistor DX may be controlled depending on the amount of the charges accumulated in the floating diffusion region FD. The driving transistor DX may serve as a source-follower buffer amplifier in combination with a current source disposed outside the unit pixel PX. As an example, the driving transistor DX may amplify a potential change caused by the accumulation of the charges in the floating diffusion region FD, and may output the amplified potential change to an output line Vout.

The select transistor SX may select unit pixels PX to be read in units of rows. When the select transistor SX is turned on, an electrical signal output from the driving transistor DX may be transmitted to the select transistor SX.

The image sensor 1 may provide an autofocusing function in at least one of pixel groups including a plurality of unit pixels sharing the floating diffusion region FD, based on the pixel circuit illustrated in FIG. 2. As an example, the image sensor 1 may provide an autofocusing function for one direction using the first photodiode PD1 and the second photodiode PD2.

In further detail, the logic circuit may provide an autofocusing function for a horizontal direction using a first pixel signal obtained after the first transmission transistor TX1 is turned on and a second pixel signal obtained after the second transmission transistor TX2 is turned on.

Figure 3A:
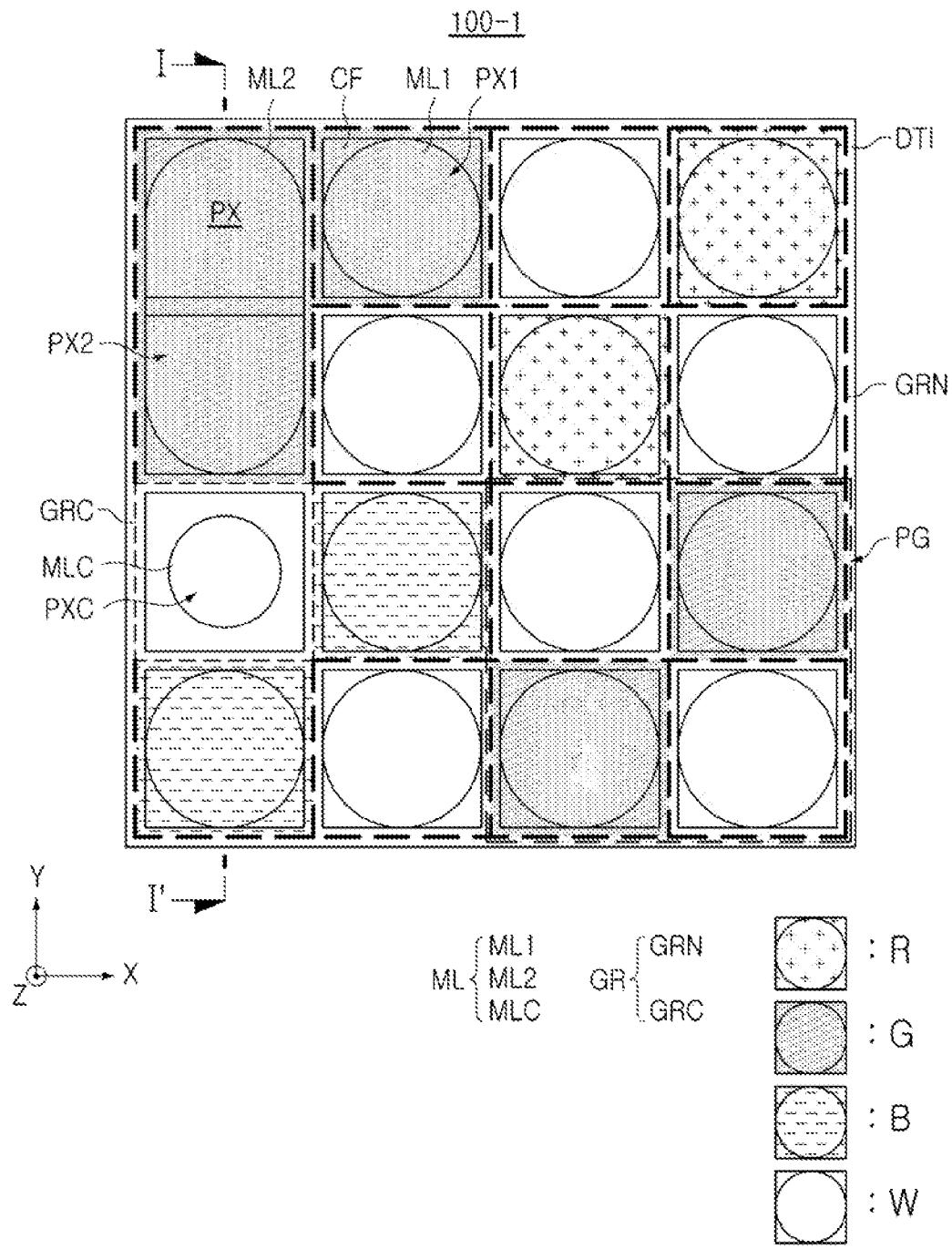
FIGS. 3A and 3B are plan views illustrating pixel groups included in an image sensor according to an example embodiment.
Figure 3B:
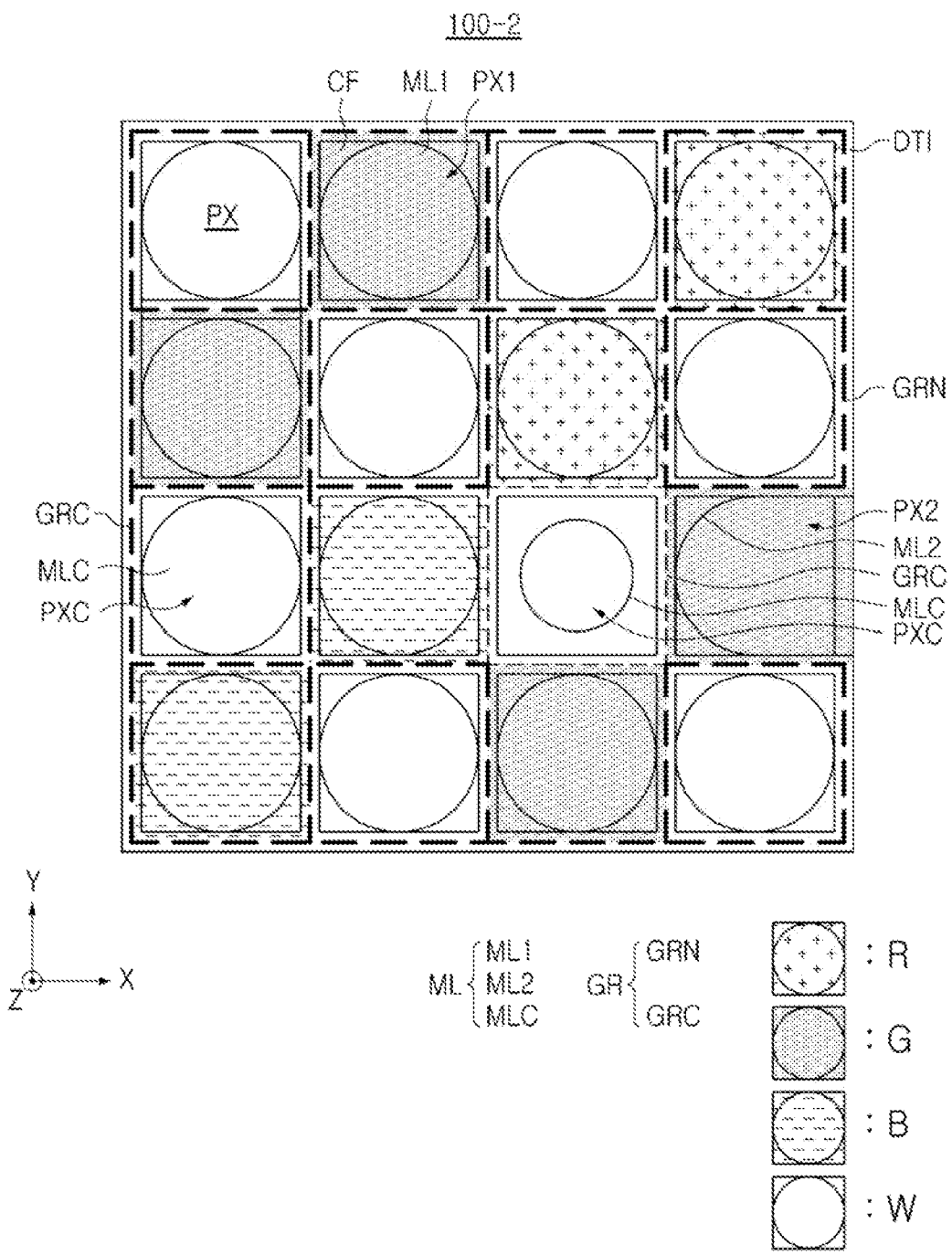

FIGS. 3A and 3B are plan views illustrating pixel groups included in an image sensor according to an example embodiment.

FIGS. 3A and 3B illustrate pixel groups PG corresponding to a single color filter array included in image sensors 100-1 and 100-2 according to example embodiments and configurations thereof.

Referring to FIG. 3A, the image sensor 100-1 may include a normal pixel PX1, an autofocusing pixel PX2, and a compensation pixel PXC. A pair of unit pixels PX may be included in the autofocusing pixel PX2. Unit pixels PX may be grouped as a pixel group PG (e.g., four unit pixels arranged in a 2-by-2 matrix may form a pixel group PG). Each pixel group PG may include a chromatic (R, G, or B) color filter CF and a transparent (W) color filter CF. The transparent (W) color filter CF may be included in the compensation pixel PXC. A device isolation layer DTI may define each unit pixel PX. A grid GR may be disposed on the device isolation layer DTI, the grid GR including a normal grid GRN (separating one color filter from another, adjacent color filter CF) and a compensation grid GRC (surrounding the transparent color filter CF included in the compensation pixel PXC). Microlenses ML may include a normal microlens ML1, a compensation microlens MLC, and an autofocusing microlens ML2. The normal microlens ML1 may be included in the normal pixel PX1. The compensation microlens MLC may be included in the compensation pixel PXC. The autofocusing microlens ML2 may be shared by the pair of unit pixels PX included in the autofocusing pixel PX2.

One color filter array may correspond to four pixel groups PG, and each of the pixel groups PG may have a color filter CF having a predetermined color disposed thereover in a first direction (e.g., a Z direction).

To summarize and further describe FIG. 3A, and also referring to FIG. 3B, in the image sensors 100-1 and 100-2, each of the pixel groups PG may include a plurality of unit pixels PX arranged in a 2-by-2 array. Referring to FIGS. 3A and 3B, each of the pixel groups PG may include a chromatic color filter and a transparent color filter. As an example, in each of the pixel groups PG, the chromatic color filter and the transparent color filter may be alternately arranged in a second direction (for example, an X direction), perpendicular to a first direction, and a third direction (e.g., a Y direction), perpendicular to the first direction and the second direction.

A plurality of unit pixels PX, included in each pixel group PG, may be defined by a device isolation layer DTI disposed therebetween, and a grid GR may be disposed on the device isolation layer DTI. Each of the plurality of unit pixels PX, separated by the device isolation layer DTI, may include a photodiode and a microlens ML disposed on the color filter CF. The microlens ML may be disposed in an uppermost portion of the unit pixels PX in the first direction, such that light is incident.

The plurality of unit pixels PX included in the image sensors 100-1 and 100-2 may include at least one normal pixel PX1 and at least one autofocusing pixel PX2, and at least one compensation pixel PXC. The normal pixel PX1 and the compensation pixel PXC may be pixels for generating an image using an obtained pixel signal, and the autofocusing pixel PX2 may a pixel for autofocusing a subject using a phase difference of incident light. The compensation pixel PXC may be a pixel for preventing crosstalk which may occur in the autofocusing pixel PX2.

The autofocusing pixel PX2 may include a pair of unit pixels PX arranged side by side in the second direction or the third direction. The image sensor 100-1 illustrated in FIG. 3A may include an autofocusing pixel PX2 including two unit pixels PX arranged side by side in the third direction. On the other hand, the image sensor 100-2 illustrated in FIG. 3B may include an autofocusing pixel PX2 including two unit pixels PX arranged side by side in the second direction. The compensation pixel PXC may be disposed on one side of the autofocusing pixel PX2 in a direction in which two unit pixels PX included in the autofocusing pixel PX2 are arranged.

Referring to FIG. 3A, a pair of unit pixels PX included in the autofocusing pixel PX2 may be included in a single pixel group PG. On the other hand, referring to FIG. 3B, a pair of unit pixels PX included in the autofocusing pixel PX2 may be included across two pixel groups PG adjacent to each other.

In the image sensors 100-1 and 100-2, each of the pixel groups PG may include a chromatic color filter CF, having at least one of green (G), red (R), and blue (B) colors, and a transparent (W) color filter CF. As an example, the image sensors 100-1 and 100-2 may include green (G), red (R), blue (B), and transparent (W) color filters CF.

The image sensors 100-1 and 100-2 may include a single color filter array for each of the pixel groups PG arranged in a 2-by-2 array. As an example, the pixel groups PG including the green (G) color filter may be disposed alternately with the pixel groups PG including the red (R) or blue (B) color filter in the second direction (for example, an X direction) and the third direction (e.g., a Y direction). However, in the autofocusing pixel PX2 performing an autofocusing function, chromatic color filters CF having the same color may be disposed to be adjacent to each other, unlike other unit pixels PX, to use a phase difference of light incident on a pair of unit pixels adjacent to each other.

In other words, among the pixel groups PG, a pixel group PG including only a normal pixel PX1 and a compensation pixel PXC may include two transparent color filters CF, not adjacent to each other, and two chromatic color filters CF, not adjacent to each other.

In the image sensors 100-1 and 100-2 according to example embodiments, the normal pixel PX1 may include a normal microlens ML1, disposed on the chromatic or transparent color filter CF, and a normal grid GRN separating one color filter from another, adjacent color filter CF. The autofocusing pixel PX2 may include an autofocusing microlens ML2, shared by a pair of unit pixels PX included in the autofocusing pixel PX2, and a normal grid GRN. The compensation pixel PXC may include a compensation microlens MLC, disposed on the transparent color filter CF, and a compensation grid GRC.

In general, in an image sensor that includes a transparent color filter, a unit pixel that is disposed on one side of an autofocusing pixel may include the transparent color filter. In this case, an autofocusing function of the image sensor performed by the autofocusing pixel may be affected by the unit pixel including the transparent color filter. For example, a unit pixel including a chromatic color filter may be disposed around one of a pair of unit pixels included in the autofocusing pixel, and another unit pixel including the transparent color filter may be disposed around the other of the pair of unit pixels included in the autofocusing pixel. In such a structure, the pair of unit pixels included in the autofocusing pixel may generate an asymmetrical output, which may cause crosstalk to occur in the autofocusing pixel and thereby deteriorate an autofocusing function of an image sensor.

By comparison, in the image sensors 100-1 and 100-2 according to example embodiments, the unit pixel PX that is adjacent to the autofocusing pixel PX2 and includes the transparent color filter CF may be formed as the compensation pixel PXC to address the above issue. That is, the compensation pixel PXC may include the compensation microlens MLC, having a size smaller than a size of the normal microlens ML1 included in the normal pixel PX1, to compensate for or prevent the asymmetrical output generated in the pair of unit pixels PX included in the autofocusing pixel PX2. Accordingly, the image sensors 100-1 and 100-2 may perform an improved autofocusing function, as compared with the case in which the compensation pixel PXC is not included.

Additionally, with respect to the above, the compensation microlens MLC included in the compensation pixel PXC has a size that is smaller than a size of the normal microlens ML1, which could cause a loss in sensitivity of the compensation pixel PXC. However, in the image sensors 100-1 and 100-2 according to example embodiments, the compensation grid GRC surrounding the transparent color filter CF (included in the compensation pixel PXC) may be formed to be smaller than a normal grid, so that an area of an opening of a pixel may be increased to significantly reduce loss in sensitivity.

Figure 4:
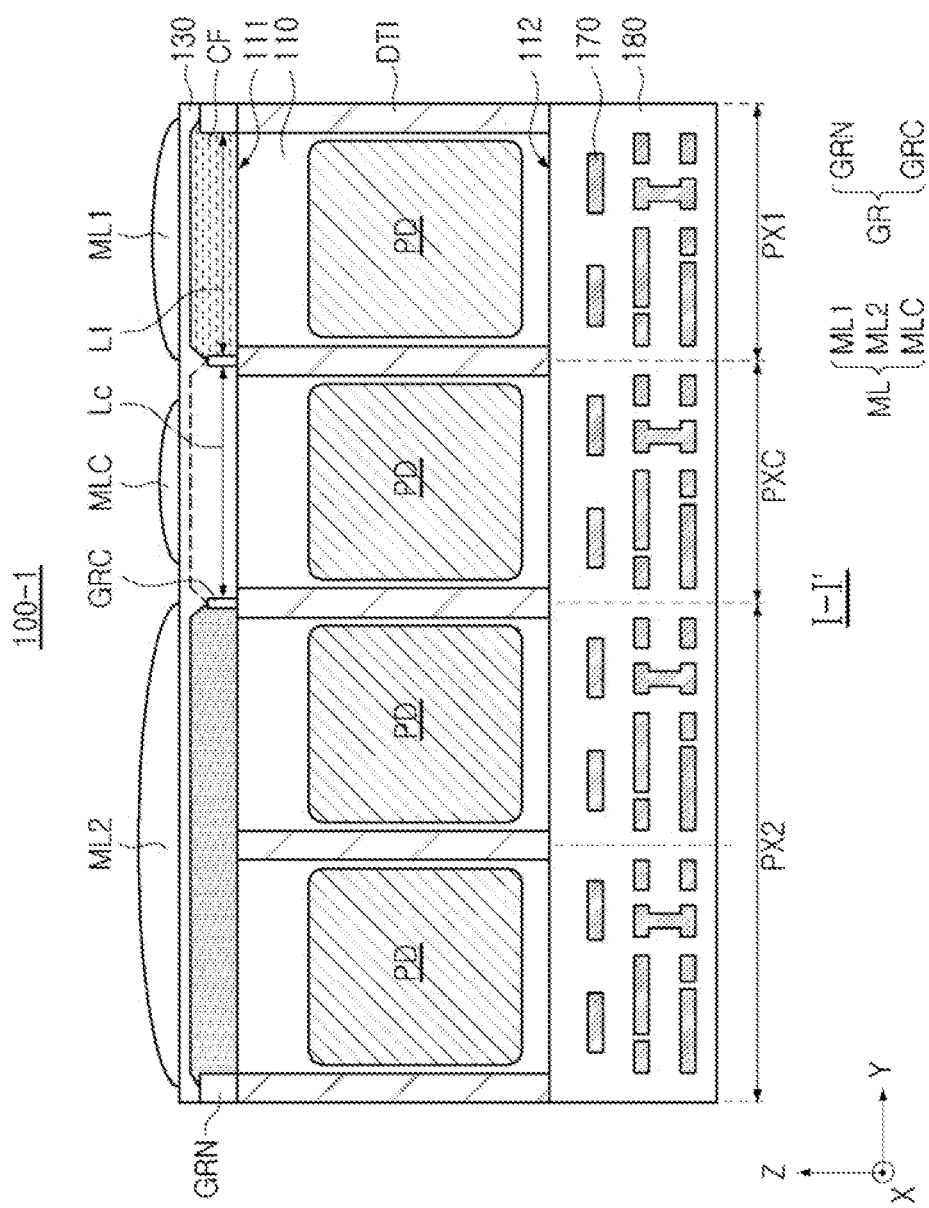
FIG. 4 is a cross-sectional view illustrating an image sensor according to an example embodiment.

FIG. 4 is a cross-sectional view illustrating an image sensor according to an example embodiment.

FIG. 4 is a cross-sectional view of the image sensor 100-1, illustrated in FIG. 3A, taken along line I-I'.

Referring to FIG. 4, the image sensor 100-1 may include a substrate 110 having a first surface 111 and a second surface 112 opposing each other, a photodiode PD disposed in the substrate 110 in each of a plurality of unit pixels PX, and a device isolation layer DTI disposed between the plurality of unit pixels PX.

The plurality of unit pixels PX may include at least one normal pixel PX1, at least one autofocusing pixel PX2, and at least one compensation pixel PXC arranged in a direction that is parallel to the first surface 111 (e.g., a Y direction).

In the normal pixel PX1, a color filter CF, a light transmitting layer 130, and normal microlenses ML1 may be sequentially disposed. As an example, in the image sensor 100-1 illustrated in FIG. 4, the color filter CF included in the normal pixel PX1 may be a blue (B) color filter.

Light, incident through the normal microlens ML1, may be incident on the photodiode PD included in the normal pixel PX1. As described above, the normal pixel PX1 may generate an image using a corresponding normal microlens ML1 and a corresponding photodiode PD.

In the autofocusing pixel PX2, a color filter CF corresponding to the autofocusing pixel PX2, a light transmitting layer 130, and an autofocusing microlens ML2 may be sequentially disposed on the first surface 111 of the substrate 110. As an example, in the image sensor 100-1 illustrated in FIG. 4, the color filter CF included in the autofocusing pixel PX2 may be a green (G) color filter, and the autofocusing microlens ML2 may have a shape extending in a third direction (e.g., a Y direction) to correspond to the autofocusing pixel PX2.

In the compensation pixel PXC, a transparent color filter CF, a light transmitting layer 130, and a compensation microlens MLC may be sequentially disposed on the first surface 111 of the substrate 110. The compensation microlens MLC may have a size, e.g., an area in a plan view, that is smaller than a size of the normal microlens ML1. As an example, the compensation microlens MLC may have the same refractive index as the normal microlens ML1 and have a diameter that is smaller than a diameter of the normal microlens ML1.

Referring to FIGS. 3A and 4 together, the color filters CF included in the image sensor 100-1 may be separated from each other by the grid GR disposed on the device isolation layer DTI. The grid GR may include a metal or a transparent material. In FIG. 4, the image sensor 100-1 is illustrated as an example of a grid GR including a transparent material.

Among grids GR included in the image sensor 100-1, some grids GR may have different sizes. For example, in the image sensor 100-1, grids GR may include a normal grid GRN and a compensation grid GRC.

In other implementations, the image sensor 100-1 may include grids GR having various sizes.

Referring to FIGS. 3A and 4, the transparent color filter CF included in the compensation pixel PXC may be separated from other, adjacent color filters CF by the compensation grid GRC. The color filter CF, included in the normal pixel PX1 and the autofocusing pixel PX2, may be separated from other, adjacent color filters CF by a normal grid GRN having a size greater than a size of the compensation grid GRC. As an example, the compensation grid GRC may have a length shorter than a length of the normal grid GRN in all directions.

A size of a grid GR disposed between two different types of adjacent pixels may correspond to a size of a smaller microlens ML, among microlenses ML included in the two different types of adjacent pixels. As an example, a grid GR disposed between the compensation pixel PXC and the normal pixel PX1 may correspond to a size of a compensation microlens MLC, which has a smaller size, among the compensation and normal microlenses MLC and ML1. Accordingly, the compensation grid GRC may be disposed between the compensation pixel PXC and the normal pixel PX1.

Due to a difference in size between the grids GR, the opening of the normal pixel PX1 may be smaller than the opening of the compensation pixel PXC. For example, in a direction parallel to the third direction (e.g., a Y direction), the color filter CF included in the normal pixel PX1 may have a length that is shorter than a length of the color filter CF included in the compensation pixel PXC. Thus, in the image sensor 100-1 illustrated in FIG. 4, the color filter CF included in the normal pixel PX1 may have a length L1 and the color filter CF included in the compensation pixel PXC may have a length Lc that is greater than L1.

As described above, in the image sensor 100-1 according to an example embodiment, an opening of the compensation pixel PXC may be formed to be larger than an opening of each of the other pixels to significantly reduce loss in sensitivity which may occur due to a size of the compensation microlens MLC.

Referring to FIG. 4, in the image sensor 100-1, a pixel circuit may be disposed below the photodiode PD. The pixel circuit may be operated to obtain a pixel signal from the plurality of unit pixels PX.

The pixel circuit may include interconnection patterns 170 and an insulating layer 180 covering the interconnection patterns 170, and may be disposed on the second surface 112 of the substrate 110.

Although not illustrated in FIG. 4, the pixel circuit may include a plurality of elements, including a transmission transistor and a floating diffusion region.

Figure 5:
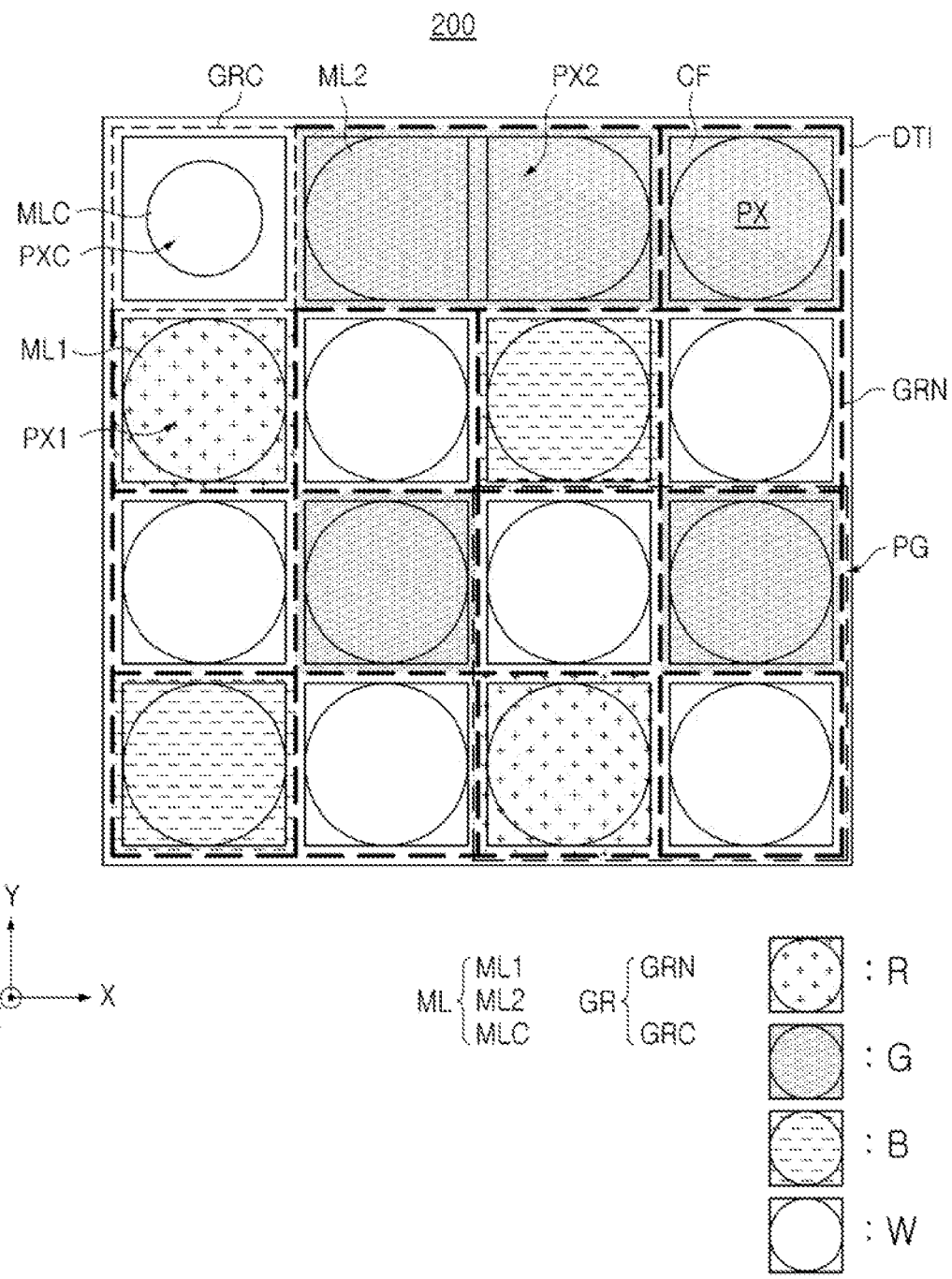
FIGS. 5 to 7 are plan views illustrating pixels groups included in image sensors according to example embodiments, respectively.
Figure 6:
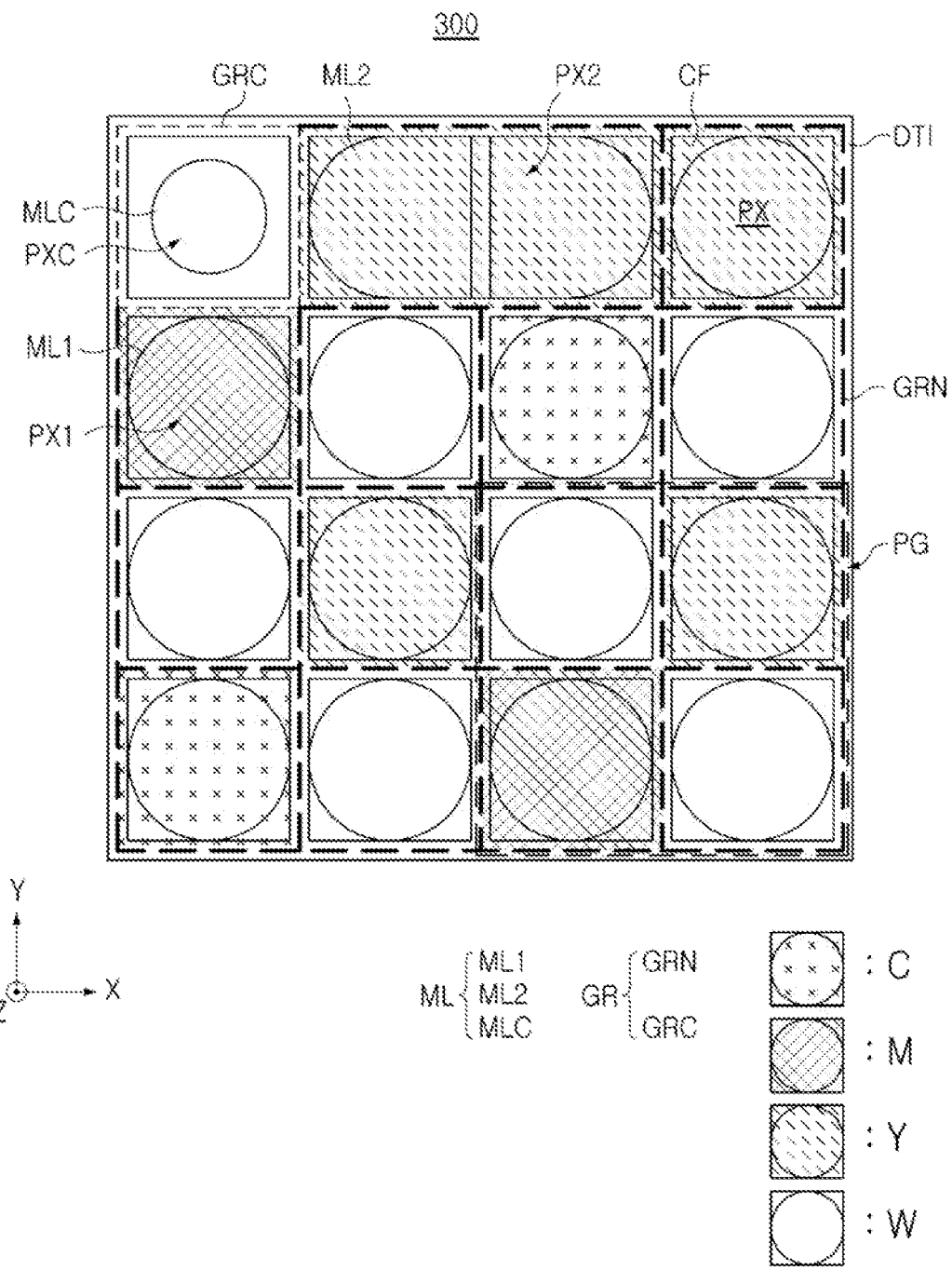
Figure 7:
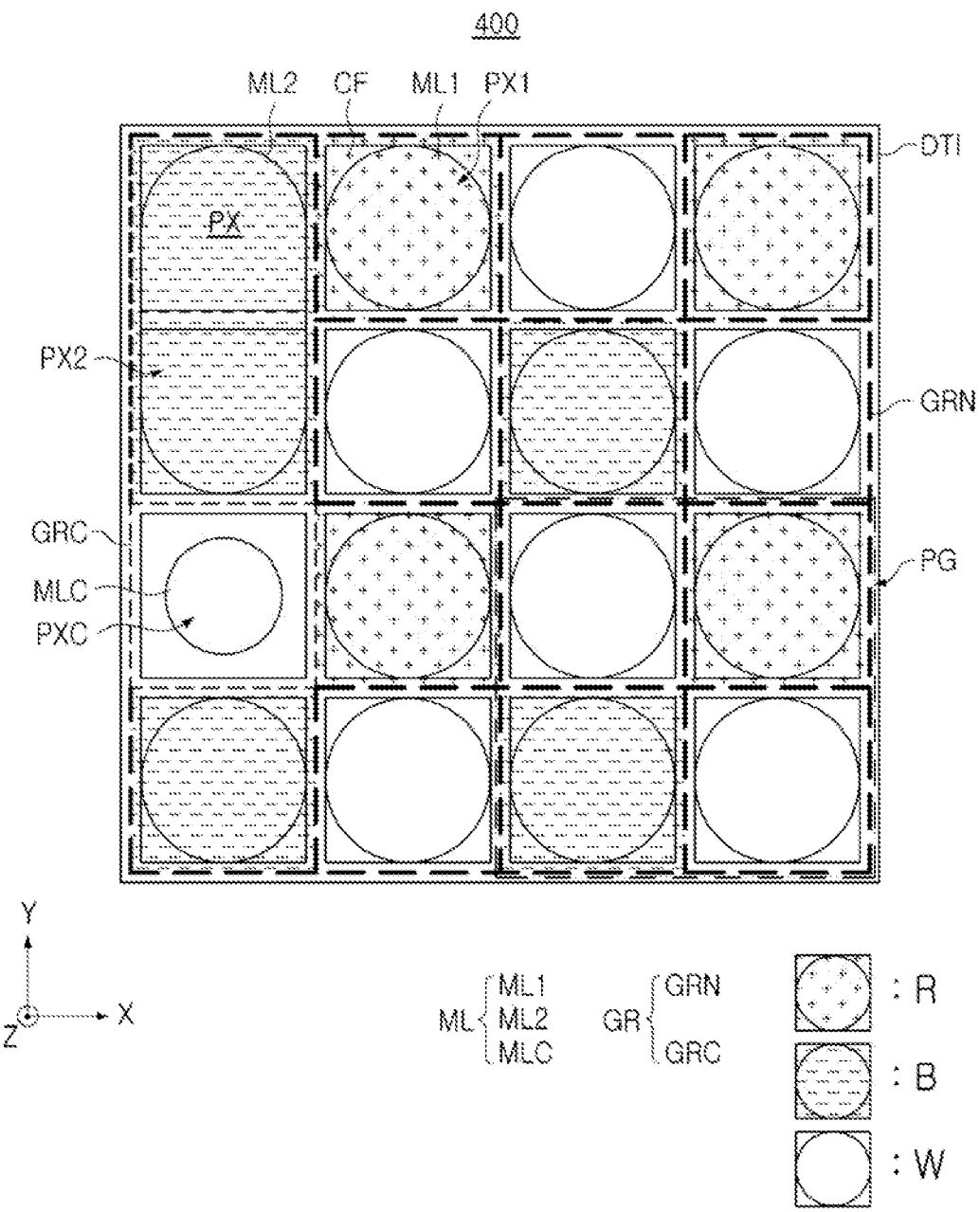

FIGS. 5 to 7 are plan views illustrating pixels groups included in image sensors according to example embodiments, respectively.

As described above, in the image sensors 100-1 and 100-2 according to example embodiments, each of the pixel groups PG may include a chromatic color filter CF, having at least one of green (G), red (R), and blue (B) colors, and a transparent (W) color filter CF.

Referring to FIG. 5, similarly to the image sensor 100-1 illustrated in FIG. 3A, an image sensor 200 according to an example embodiment may include a plurality of unit pixels PX including at least one normal pixel PX1, at least one autofocusing pixel PX2, and at least one compensation pixel PXC, and each of the pixels may include a corresponding microlens ML and a corresponding grid GR.

Pixel groups PG included in the image sensor 200 may each include two transparent color filters CF, not adjacent to each other, and two chromatic color filters CF, not adjacent to each other. In the image sensor 200, the chromatic color filter CF may include a red (R) or blue (B) color filter and a green (G) color filter. The pixel group PG including the red (R) color filter and the pixel group PG including the blue (B) color filter may be alternately disposed in a second direction and a third direction.

Referring to FIG. 6, similarly to the image sensor 100-1 illustrated in FIG. 3A, an image sensor 300 according to an example embodiment may include a plurality of unit pixels PX including at least one normal pixel PX1, at least one autofocusing pixel PX2, and at least one compensation pixel PXC, and each of the pixels may include a corresponding microlens ML and a corresponding grid GR.

Pixel groups PG included in the image sensor 300 may each include two transparent color filters CF, not adjacent to each other, and two chromatic color filters CF, not adjacent to each other. In the image sensor 300, the chromatic color filter CF may be one of cyan (C), magenta (M), and yellow (Y) color filters. Each of the pixel groups PG may include a cyan (C) or magenta (M) color filter and a yellow (Y) color filter. A pixel group PG including the magenta (M) color filter and a pixel group PG including the cyan (C) color filter may be alternately disposed in a second direction and a third direction.

Referring to FIG. 7, similarly to the image sensor 100-1 illustrated in FIG. 3A, an image sensor 400 according to an example embodiment may a plurality of unit pixels PX including at least one normal pixel PX1, at least one autofocusing pixel PX2, and at least one compensation pixel PXC, and each of the pixels may include a corresponding microlens ML and a corresponding grid GR.

Pixel groups PG included in the image sensor 400 may each include two transparent color filters CF, not adjacent to each other, and two chromatic color filters CF, not adjacent to each other. In the image sensor 400, each of the pixel groups PG may include a red (R) color filter and a blue (B) color filter, not adjacent to each other.

The above-described arrays of the color filters included in the image sensors 200, 300, and 400 illustrated in FIGS. 5 to 7 are only examples, and, e.g., an image sensor may include color filters having various patterns.

In the above-described example embodiments, an image sensor may include a normal pixel PX1, an autofocusing pixel PX2, and a compensation pixel PXC disposed on one side of the autofocusing pixel PX2. The compensation pixel PXC may include a compensation microlens MLC having a small size and compensation grid GRC having a small size.

Figure 8:
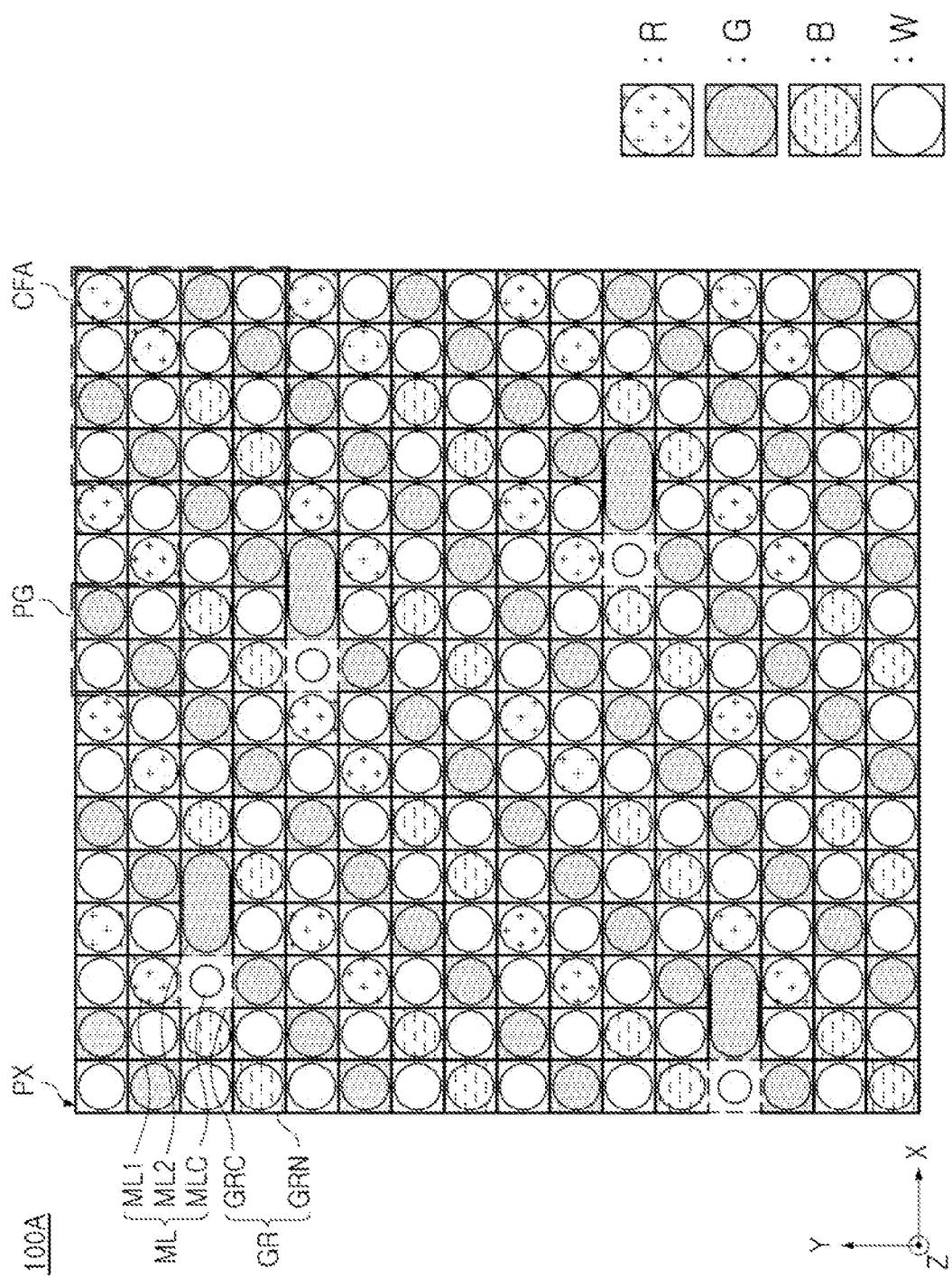
FIG. 8 is a plan view illustrating a pixel array included in an image sensor according to an image sensor.

FIG. 8 is a plan view illustrating a pixel array included in an image sensor according to an example embodiment.

FIG. 8 illustrates an example of the pixel array 100A of the image sensor 100-2 illustrated in FIG. 3B.

The pixel array 100A may include a plurality of unit pixels PX arranged in a direction parallel to an upper surface of a substrate, and a logic circuit (not shown in FIG. 8) for obtaining a pixel signal from the plurality of unit pixels PX.

In the pixel array 100A, each of the plurality of unit pixels PX may be defined by a device isolation layer. The plurality of unit pixels PX may constitute a pixel group PG for every 2-by-2 array. The pixel groups PG may include a color filter having a color filter array CFA having a regular pattern in every 2-by-2 array.

An autofocusing pixel PX2 may include a pair of unit pixels PX arranged side by side, and the pair of unit pixels PX may include a chromatic color filters having the same color. Accordingly, the color filter array CFA may be irregular in some pixel groups PG.

Each of the plurality of unit pixels PX may be one of a normal pixel PX1, an autofocusing pixel PX2, and a compensation pixel PXC. Each of the plurality of unit pixels PX may include color filters, separated from each other by a grid GR disposed on a device isolation layer, and microlenses ML disposed on the color filters.

The compensation pixel PXC may be disposed on one side of the autofocusing pixel, and may include a transparent color filter. The compensation pixel PXC may be formed to compensate for a signal output from the autofocusing pixel PX2. As an example, the signal output from the autofocusing pixel PX2 may be a signal for performing an autofocusing function, and the compensation pixel PXC may compensate for an asymmetric output signal to improve the autofocusing function of the image sensor 100-2. The compensation may be implemented by a compensation microlens MLC included in the compensation pixel PXC. The compensation microlens MLC may be smaller than a normal microlens ML1 included in a normal pixel PX1. Loss in sensitivity in the compensation pixel PXC, caused by a difference in size between the microlenses ML, may be improved, e.g., mitigated, using the compensation grid GRC smaller than the normal grid GRN.

In connection with FIG. 3A, the image sensor 100-1 is described as including a single autofocusing pixel PX2 corresponding to a single pixel group PG. However, in other implementations, at least one of the plurality of pixel groups PG included in the image sensor 100-1 may not include the autofocusing pixel PX2. Also, similarly to the pixel array 100A of the image sensor 100-2 illustrated in FIG. 8, one autofocusing pixel PX2 may correspond to two pixel groups PG, e.g., a pair of unit pixels PX included in the autofocusing pixel PX2 may be disposed in each of two pixel groups PG that are adjacent to each other.

FIGS. 9 to 12 are diagrams illustrating image sensors according to example embodiments, respectively.

Figure 9:
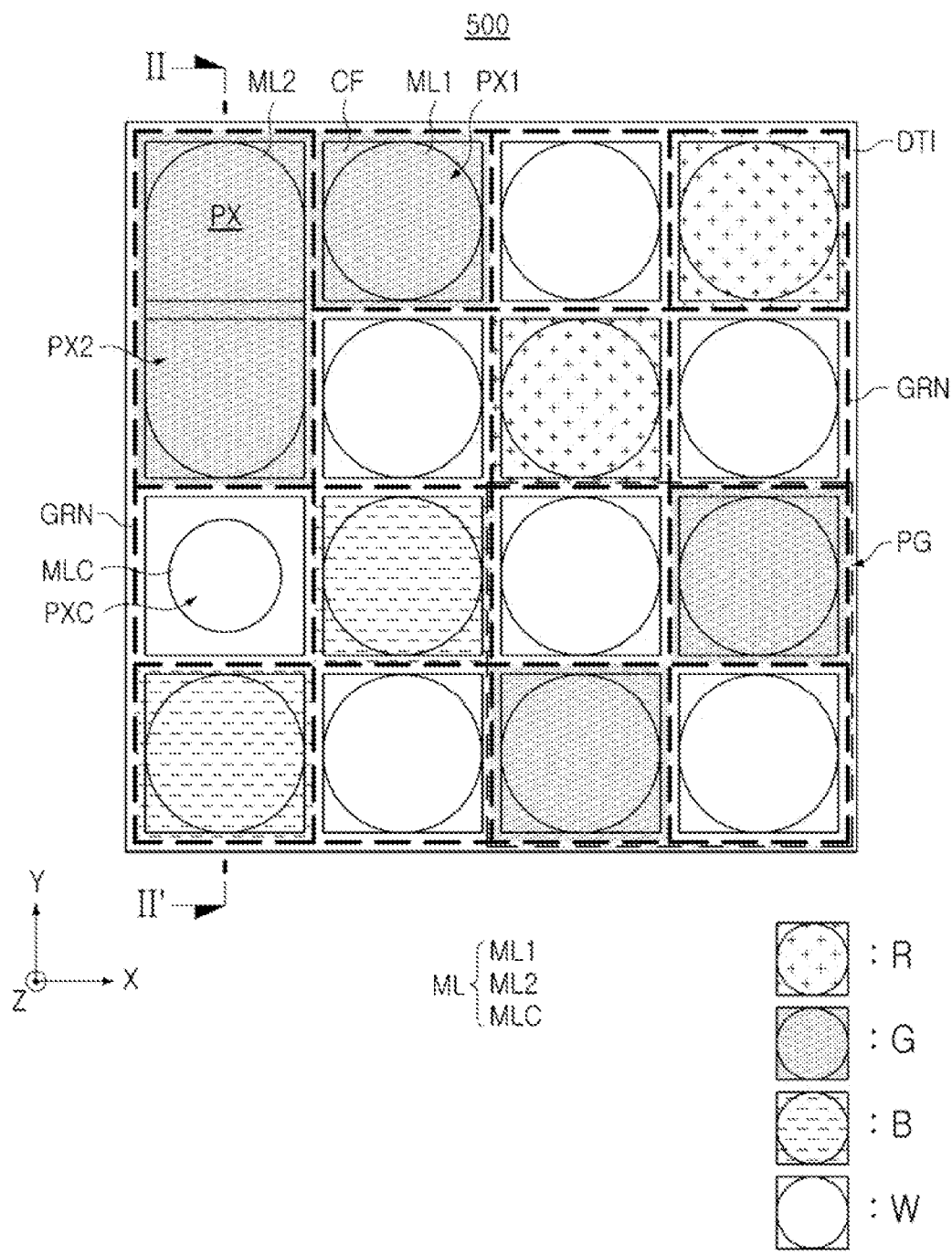
FIGS. 9 to 12 are diagrams illustrating image sensors according to example embodiments, respectively.
Figure 11:
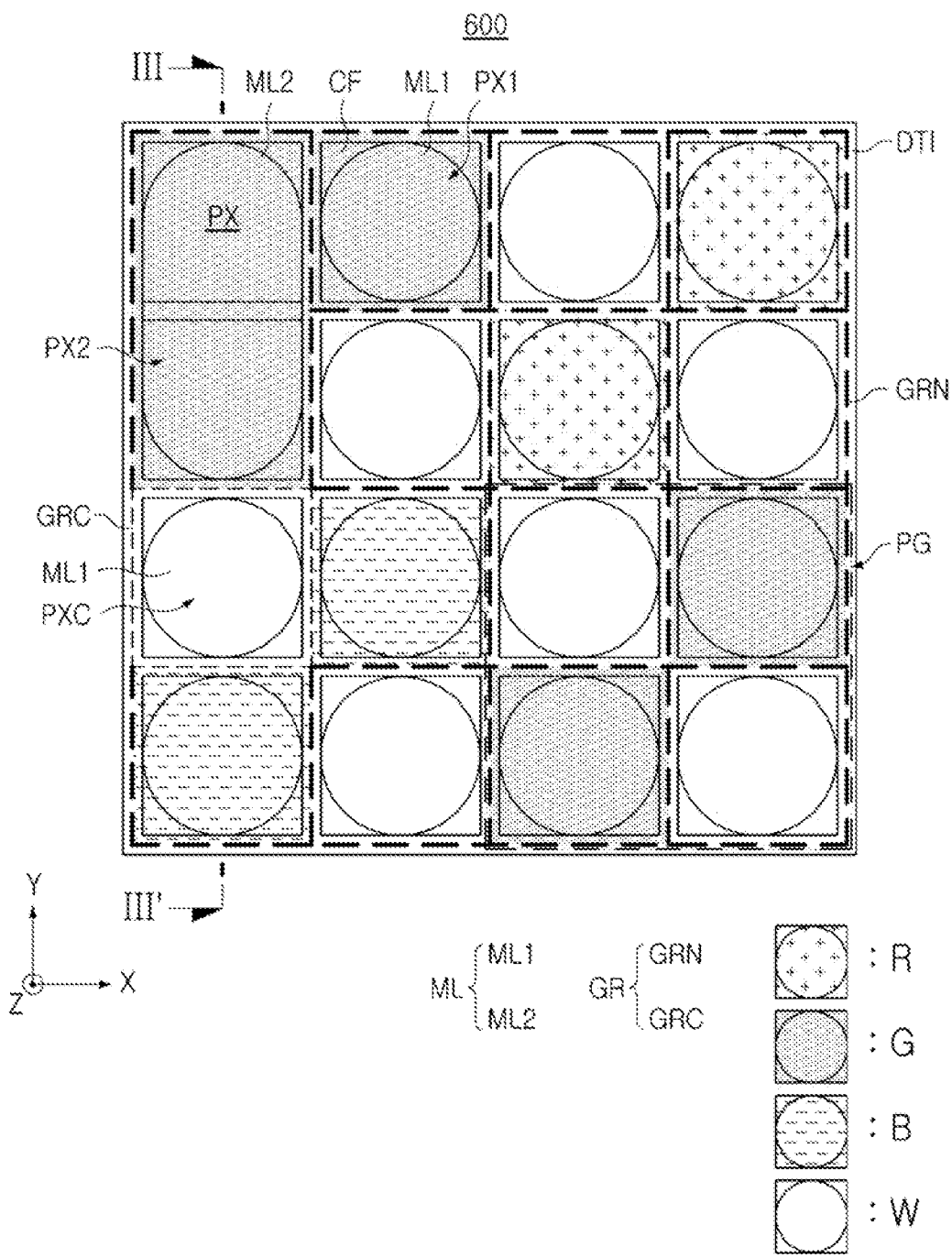

Referring to FIGS. 9 and 11, similarly to the image sensor 100-1 illustrated in FIG. 3A, image sensors 500 and 600 according to example embodiments may each include a plurality of unit pixels PX including at least one normal pixel PX1, at least one autofocusing pixel PX2, and at least one compensation pixel PXC, and each of the pixels may include a corresponding microlens ML and a corresponding grid GR.

The autofocusing pixels PX2 included in the image sensors 500 and 600 may include a pair of unit pixels PX arranged side by side in a third direction (e.g., a Y direction), perpendicular to a first direction (e.g., a Z direction). The pair of unit pixels PX included in the autofocusing pixel PX2 may share an autofocusing microlens ML2 and a chromatic color filter CF.

Figure 10:
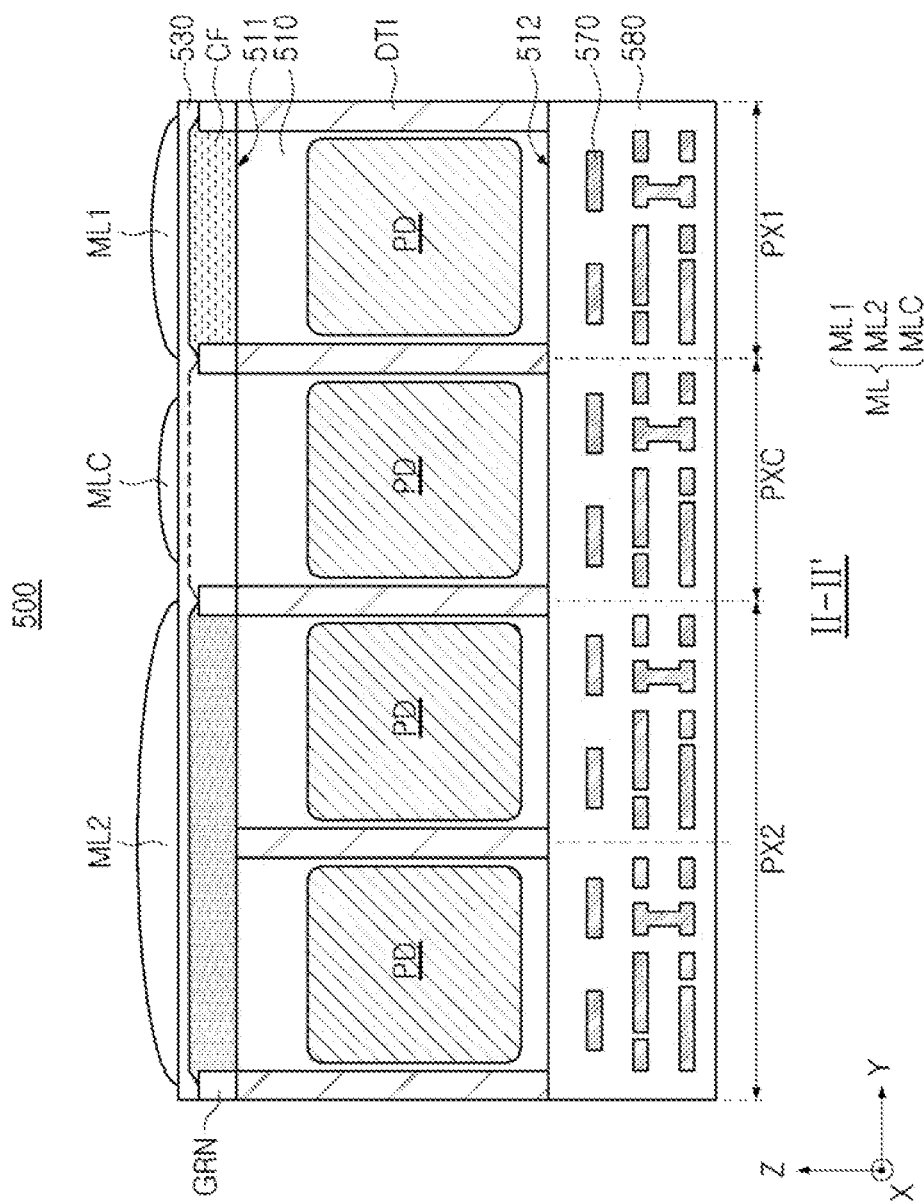

In FIGS. 9 and 10, the chromatic color filter CF in the image sensors 500 and 600 is illustrated as being a green (G) color filter. However, this is only an example and may be varied. In addition, an array of color filters and an array of a plurality of unit pixels PX may be varied relative to those illustrated in the drawings.

A compensation pixel PXC included in each of the image sensors 500 and 600 may be disposed on one side of the autofocusing pixel PX2 to compensate for a signal output from the autofocusing pixel PX2. The compensation pixel PXC may include a transparent (W) color filter, and may have a structure different from that of the normal pixel PX1.

Referring to FIG. 9, a compensation pixel PXC included in the image sensor 500 may include a compensation microlens MLC smaller than a normal microlens ML1 included in the normal pixel PX1. However, unlike the image sensor 100-1 illustrated in FIG. 3A, a grid included in the compensation pixel PXC may be the same as a normal grid GRN included in the normal pixel PX1.

On the other hand, referring to FIG. 11, the compensation pixel PXC included in the image sensor 600 may include a compensation grid GRC smaller than the normal grid GRN included in the normal pixel PX1. However, unlike the image sensor 100-1 illustrated in FIG. 3A, a microlens ML included in the compensation pixel PXC may be the same as the normal microlens ML1 included in the normal pixel PX1.

Figure 12:
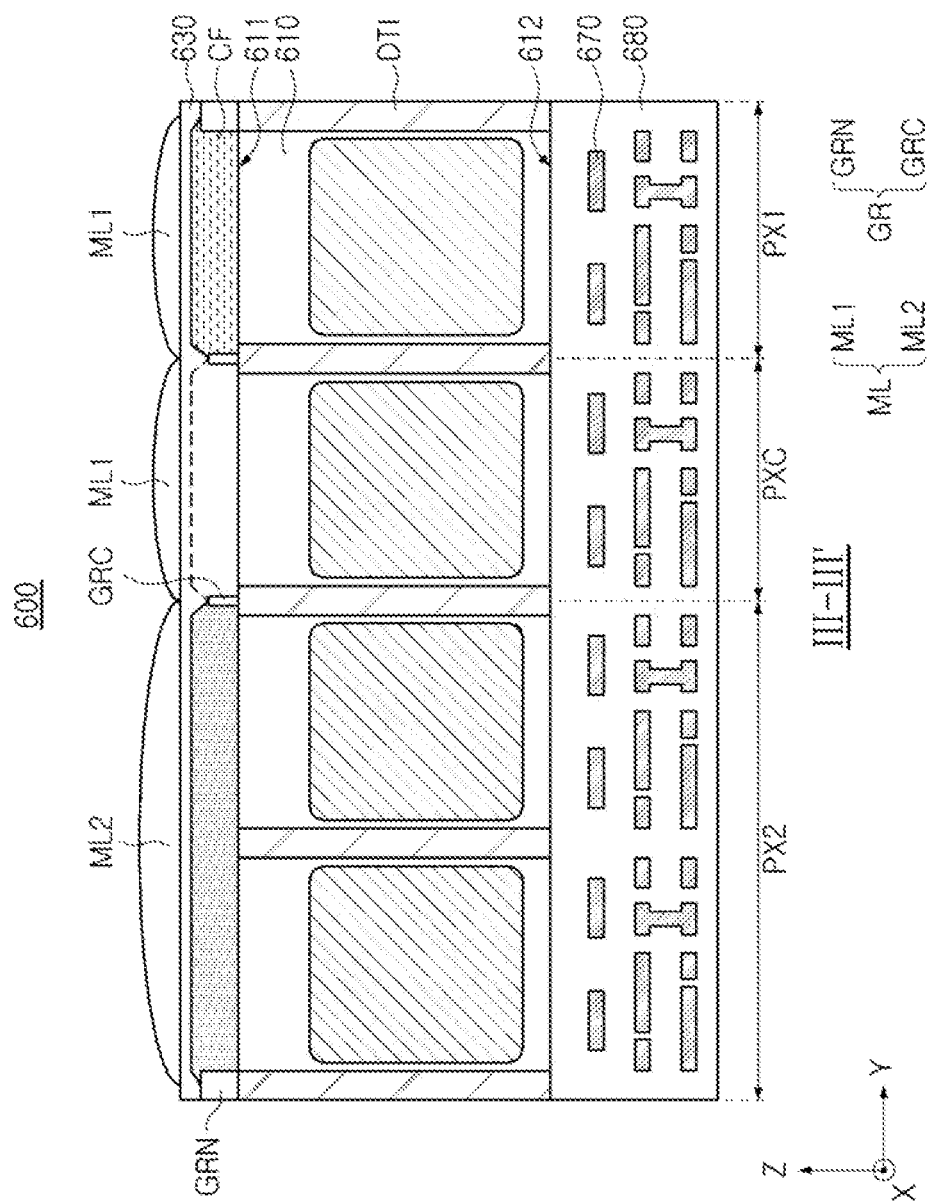

Referring to FIGS. 10 and 12, the image sensors 500 and 600 according to example embodiments may include substrates 510 and 610 having first surfaces 511 and 611 and second surfaces 512 and 612 opposing each other, photodiodes PD disposed in the substrates 510 and 610 in each of a plurality of unit pixels PX, and device isolation layers DTI disposed between the plurality of unit pixels PX. The plurality of unit pixels PX may include at least one normal pixel PX1, at least one autofocusing pixel PX2, and at least one compensation pixel PXC arranged in a direction that is parallel to the first surfaces 511 and 611, respectively.

Referring to FIG. 10, the compensation pixel PXC included in the image sensor 500 may include a compensation microlens MLC that is smaller than the normal microlens ML1 included in the normal pixel PX1.

On the other hand, referring to FIG. 11, the compensation pixel PXC included in the image sensor 600 may include a compensation grid GRC that is smaller than the normal grid GRN included in the normal pixel PX1. As an example, the compensation grid GRC may have a length shorter than a length of the normal grid GRN in all directions. Accordingly, the compensation pixel PXC of the image sensor 600 may have an opening that is wider than an opening of the normal pixel PX1.

Figure 13:
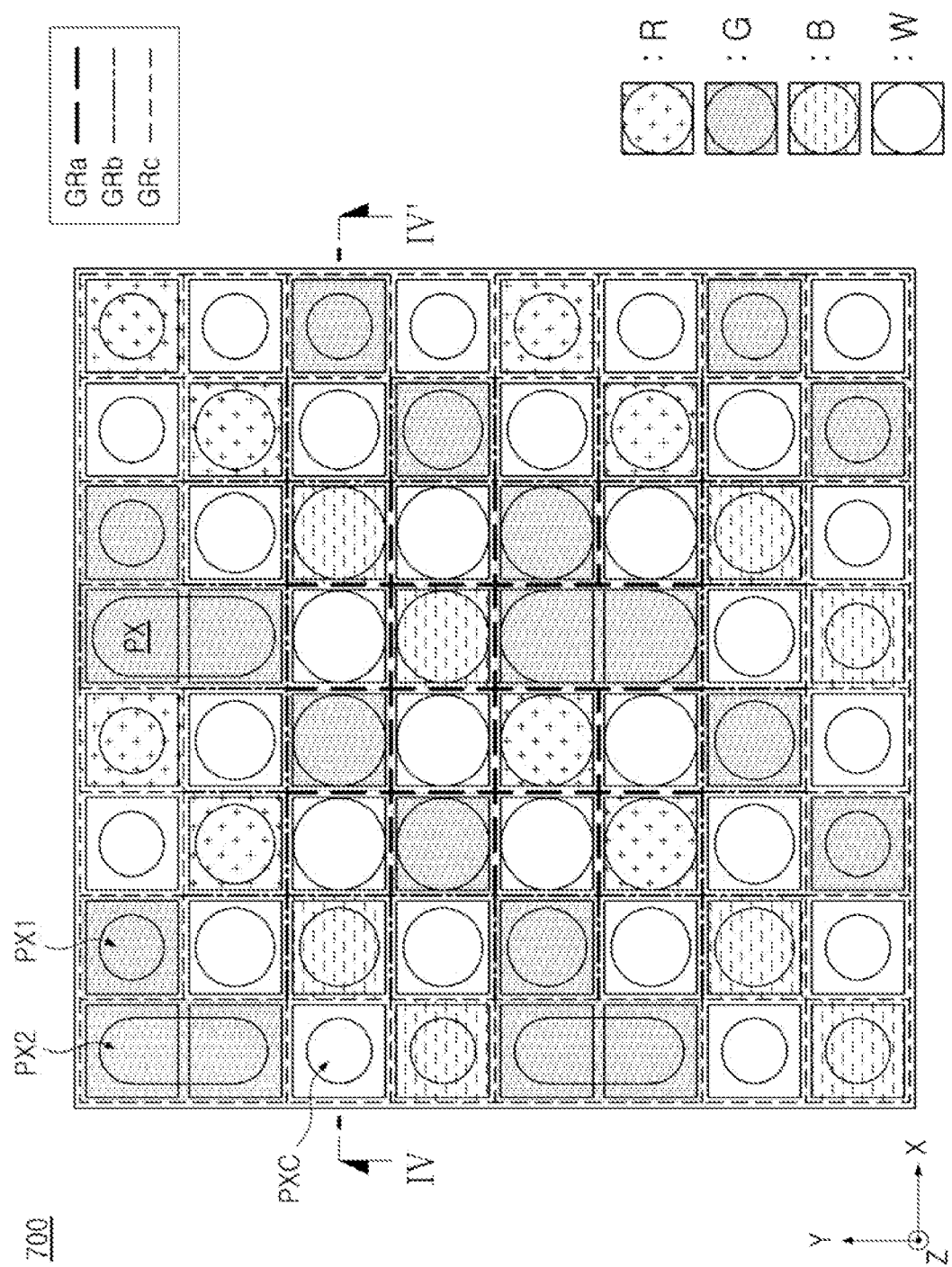
FIGS. 13 and 14 are a plan view and a cross-sectional view illustrating a pixel array included in an image sensor according to an example embodiment, respectively.
Figure 14:
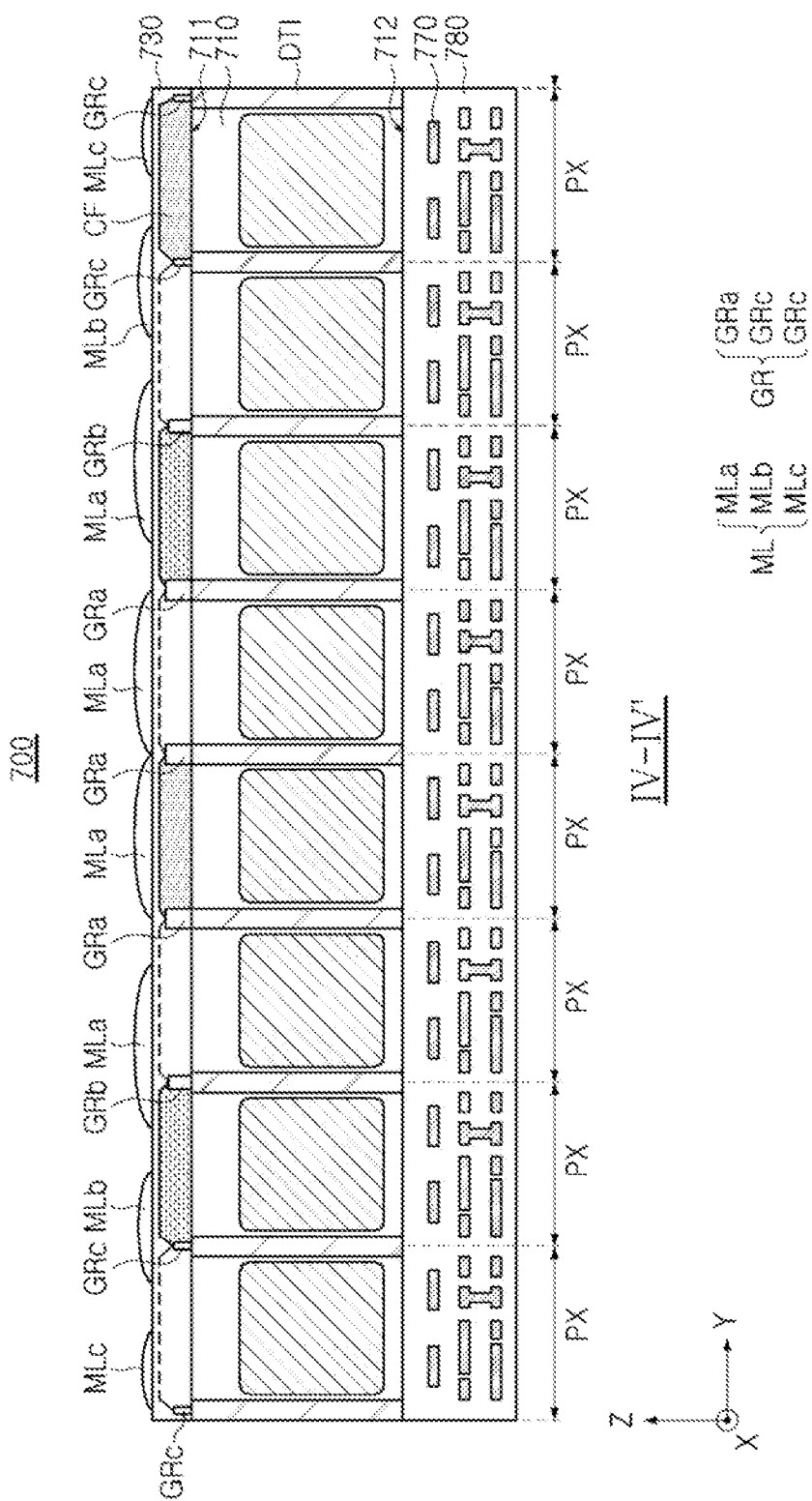

FIGS. 13 and 14 are a plan view and a cross-sectional view illustrating a pixel array included in an image sensor according to an example embodiment, respectively.

Referring to FIGS. 13 and 14, an image sensor 700 according to an example embodiment may include a pixel array in which a plurality of unit pixels PX are arranged. A plurality of unit pixels PX arranged in an 8-by-8 array are arranged in FIG. 13, as an example.

In another implementation, the pixel array may include more unit pixels PX.

In the image sensor 700, the microlens ML and the grid GR that are included in the plurality of unit pixels PX may be decreased in size in a direction toward an edge of the pixel array. As an example, a microlens MLa included in unit pixels PX disposed in a central portion of a pixel array may have a first size, and a microlens MLb included in unit pixels disposed outside the central portion of the pixel array may have a second size that is smaller than the first size. In addition, a microlens included in unit pixels PX disposed on an edge of the pixel array may have a third size that is smaller than the second size.

Similarly, a grid GRc disposed on a device isolation layer DTI that defines the unit pixels PX disposed on the edge of the pixel array may be smaller than a grid GRb disposed on a device isolation layer DTI that defines the unit pixels PX disposed in the pixel array. In addition, a grid GRa disposed on a device isolation layer DTI that defines the unit pixels PX disposed in the central portion of the pixel array may be larger than a grid GRb disposed on a device isolation layer that defines unit pixels disposed outside thereof.

In the image sensor 700, a size of the grid GR disposed between pixels including microlenses ML having different sizes may correspond to a size of a smaller microlens of microlenses included in two adjacent pixels.

Similarly to the image sensor 100-1 illustrated in FIG. 3A, the image sensor 700 may include a plurality of unit pixels PX including at least one normal pixel PX1, at least one autofocusing pixel PX2, and at least one compensation pixel PXC, and each of the pixels may include a corresponding microlens ML and a corresponding grid GR.

The image sensor 700 may prevent lens shading from occurring in an image generated using a difference in structures between a microlens ML and a grid GR in terms of the entire pixel array.

In the image sensor 700, the compensation pixel PXC, disposed on one side of the autofocusing pixel PX2 included in the image sensor 700 and including a transparent (W) color filter, may prevent crosstalk in the autofocusing pixel PX2 and may improve an autofocusing function of the image sensor 700.

Referring to FIG. 14, in the pixel array of the image sensor 700, a central axis of each of the plurality of unit pixels PX and an optical axis of the microlens ML included in each of the plurality of unit pixels PX may not overlap each other in a first direction (e.g., a Z direction). As an example, a distance between the central axis of the unit pixel PX and the optical axis of the microlens ML may be increased in a direction toward an edge of the pixel array.

In other implementations, the array of the color filters CF included in the image sensor 700 may be designed in various manners, and not only a size of the microlens ML and a size of the grid GR but also a shape of the unit pixels PX may be variously modified.

Figure 15:
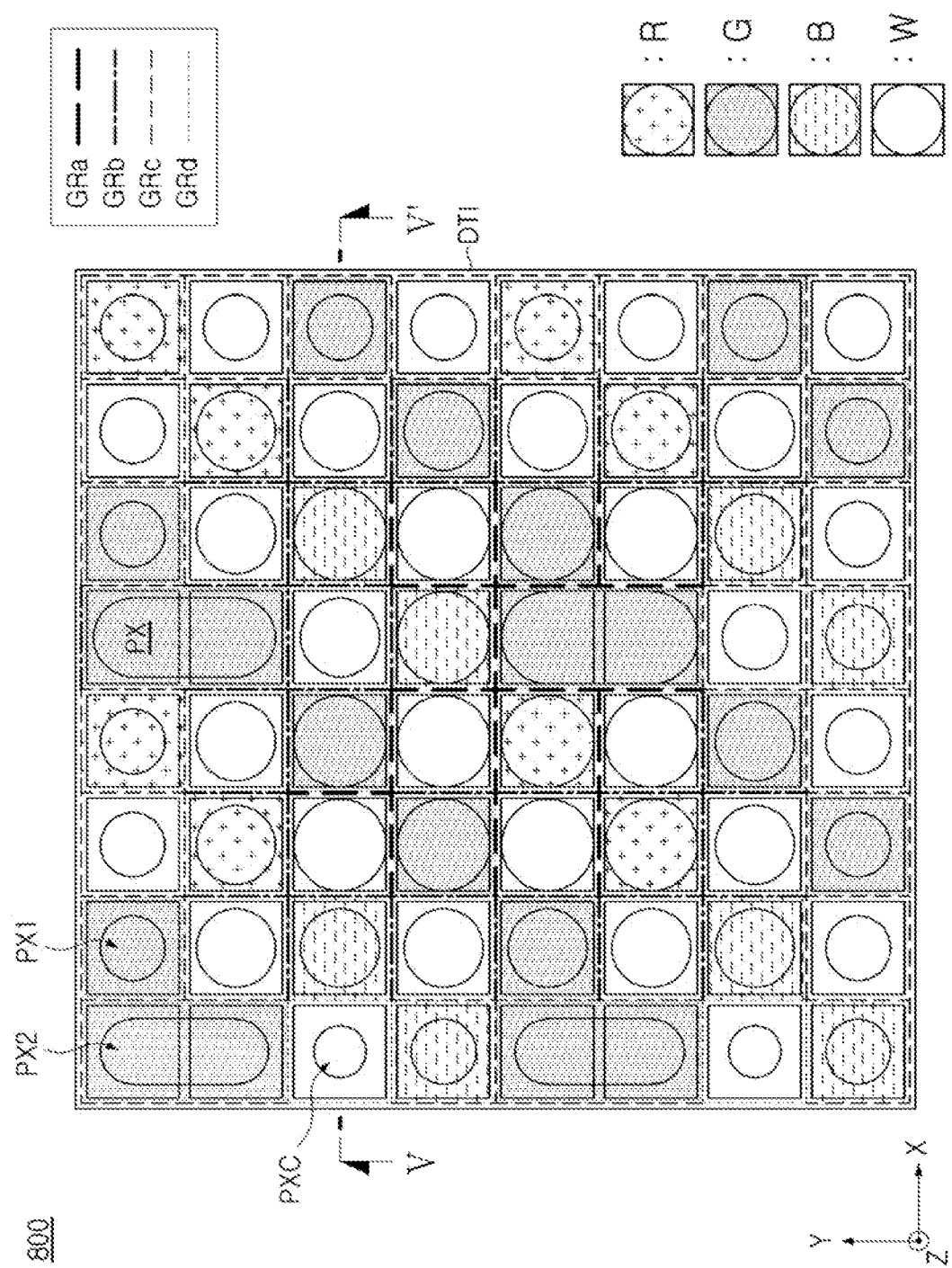
FIGS. 15 and 16 are a plan view and a cross-sectional view illustrating a pixel array included in an image sensor according to an example embodiment, respectively.
Figure 16:
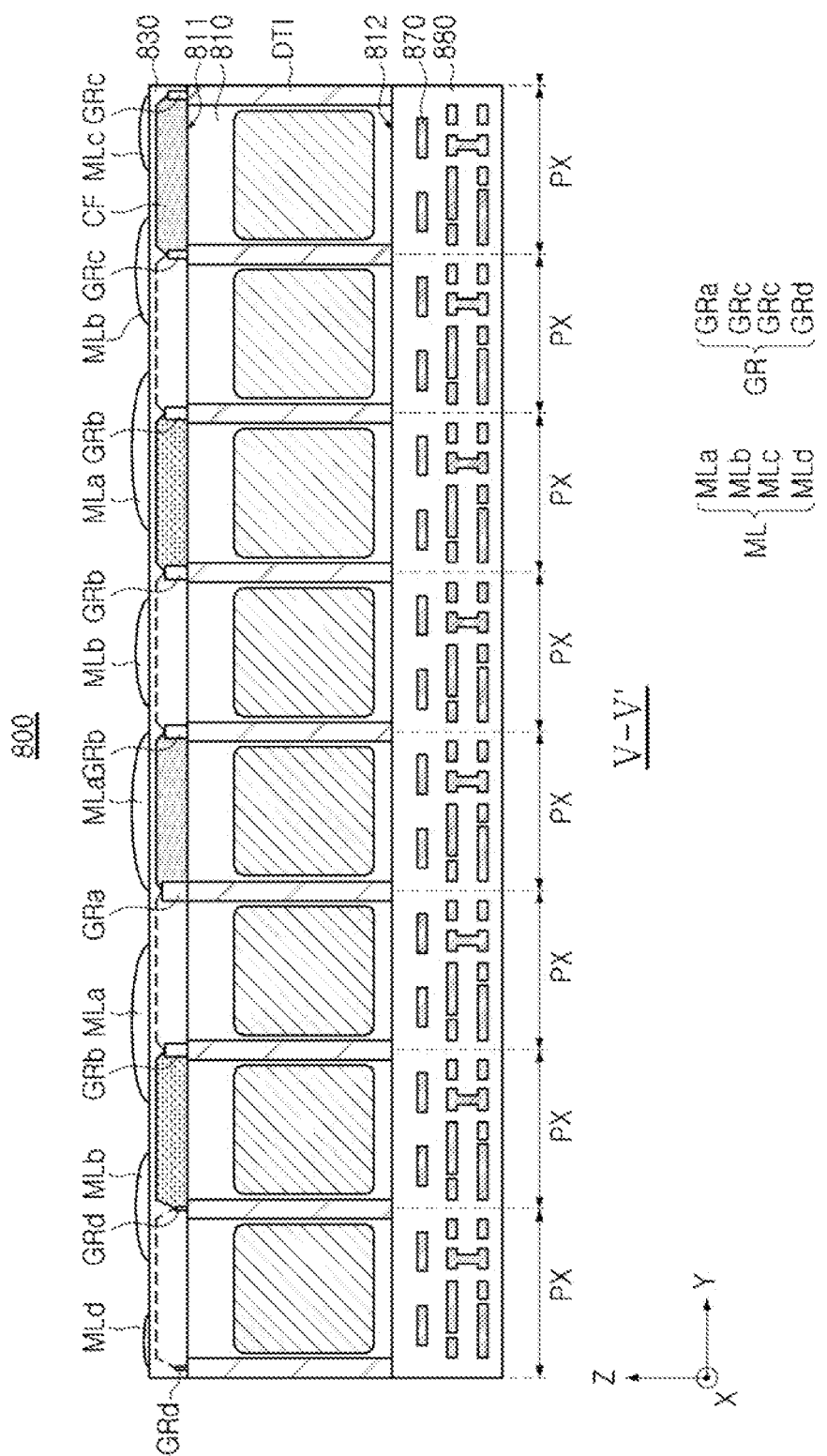

FIGS. 15 and 16 are a plan view and a cross-sectional view illustrating a pixel array included in an image sensor according to an example embodiment, respectively.

Each of FIGS. 15 and 16 may correspond to the image sensor 700 illustrated in FIGS. 13 and 14.

Referring to FIGS. 15 and 16, an image sensor 800 according to an example embodiment may include a pixel array in which a plurality of unit pixels PX are arranged.

The image sensor 800 may include a plurality of unit pixels PX including at least one normal pixel PX1, at least one autofocusing pixel PX2, and at least one compensation pixel PXC, and each of the pixels may include a corresponding microlens ML and a corresponding grid GR. The autofocusing pixel PX2 may include a pair of unit pixels PX arranged side by side in one direction, and the compensation pixel PXC may be arranged on one side of the autofocusing pixel PX2 in the one direction.

In the image sensor 800, a microlens ML and a grid GR included in the plurality of unit pixels PX may be decreased in size in a direction toward an edge of the pixel array. At the same time, the compensation pixel PXC may include a compensation microlens MLC and a compensation grid GRC disposed on a transparent (W) color filter, and each of the compensation microlens MLC and the compensation grid GRC may be smaller than a normal microlens ML1 and a normal grid GRN included in a normal pixel PX1.

As an example, a microlens MLa included in the unit pixels PX disposed in a central portion of the pixel array may have a first size, and a microlens MLb included in the unit pixels PX disposed outside the central portion of the pixel array may have a second size smaller than the first size. In addition, a microlens MLc included in unit pixels PX disposed on an edge of the pixel array may have a third size smaller than the second size.

In addition, the microlenses ML and the grid GR included in the compensation pixel PXC may be smaller than microlenses ML and a grid GR included in the normal pixel PX1 disposed therearound. As an example, a microlens MLd included in the compensation pixel PXC disposed on the edge of the pixel array may be smaller than the microlens MLc having the third size.

Similarly, the transparent color filter included in the compensation pixel PXC disposed on the edge of the pixel array may be separated from the adjacent color filter by a grid GRd having a size smaller than a size of the grid GRc included in the adjacent normal pixel PX1.

Similarly, the grid GRc disposed on the device isolation layer DTI defining the unit pixels PX disposed on the edge of the pixel array may be smaller than the grid GRb disposed on the device isolation layer DTI defining the unit pixels PX disposed inside thereof.

In addition, a grid GRa disposed on the device isolation layer DTI defining the unit pixels PX disposed in the central portion of the pixel array may be larger than the grid GRb disposed on the device isolation layer DTI defining the unit pixels PX disposed outside thereof.

Similarly to the image sensor 700 illustrated in FIGS. 13 and 14, the image sensor 800 may prevent lens shading from occurring in an image generated using a difference in structures between the microlens ML and the grid GR in terms of the entire pixel array.

In addition, the compensation pixel PXC, including a transparent (W) color filter and disposed on one side of the autofocusing pixel PX2 included in the image sensor 800, may prevents crosstalk in the autofocusing pixel PX2 and may improve an autofocusing function of the image sensor 800.

FIGS. 17A to 17F are cross-sectional views illustrating a process of forming an image sensor according to an example embodiment.

FIGS. 17A to 17F are cross-sectional views illustrating sequential operations of a process of manufacturing the image sensor 100-1 according to an example embodiment described with reference to FIG. 3A.

Figure 17A:
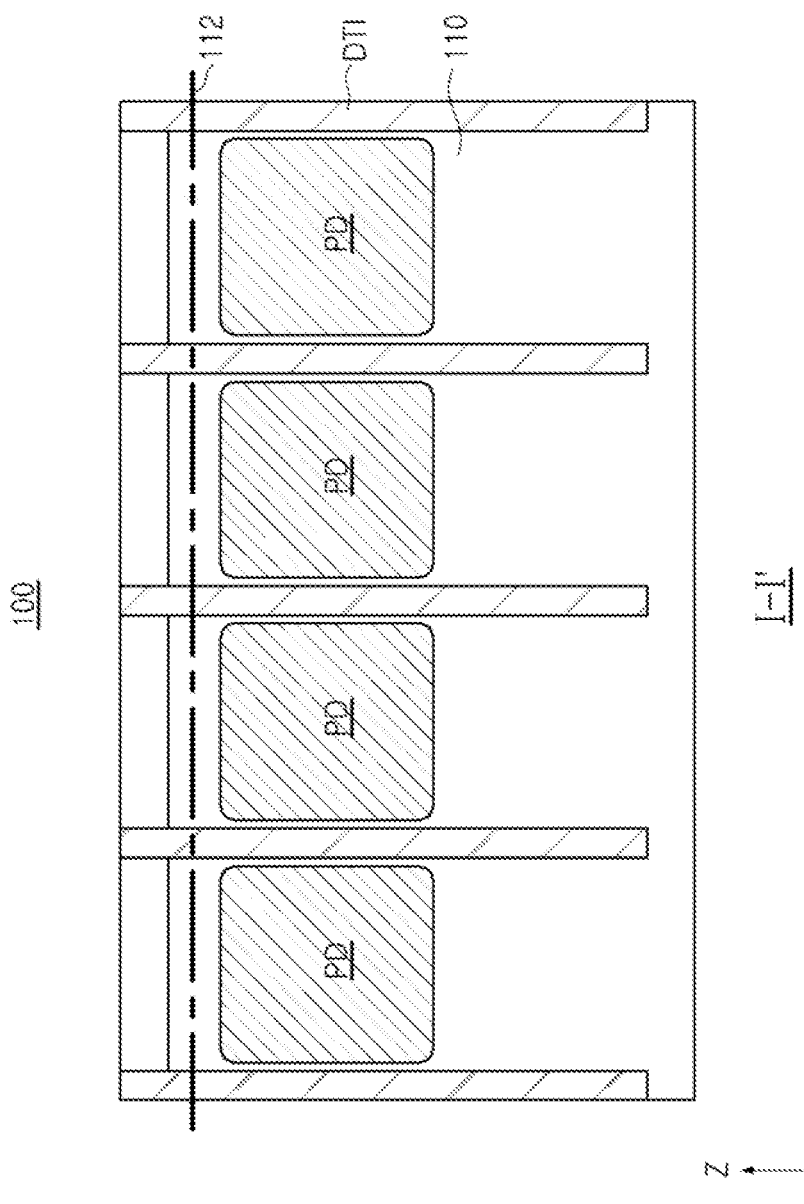
FIGS. 17A to 17F are cross-sectional views illustrating a process of forming an image sensor according to an example embodiment.

Referring to FIG. 17A, the image sensor 100-1 may be manufactured by forming a device isolation layer DTI through a trench formed on a substrate 110.

As an example, a mask layer may be stacked on one surface of the substrate 110 to form a trench only in a space in which a device isolation layer DTI is to be formed. The trench may not be formed in a space in which a mask layer is present, and an insulating material may fill a trench, formed in a space in which the mask layer is absent, to form the device isolation layer DTI. The mask layer may then be removed by a polishing process, together with a portion of the substrate 110 and a portion of the device isolation layer DTI.

An upper surface of the substrate 110, remaining after the mask layer is removed by the polishing process, may be defined as a second surface 112.

Figure 17B:
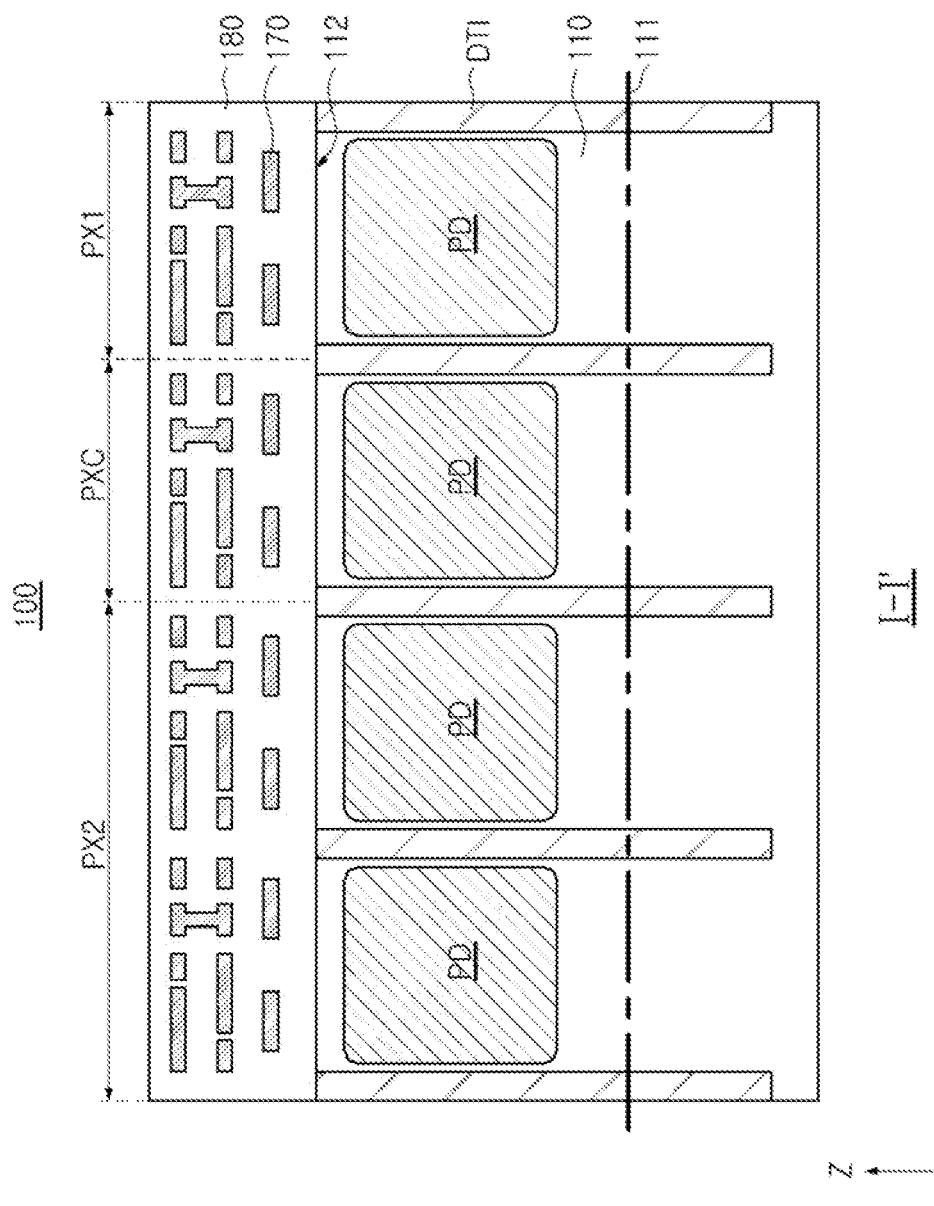

Referring to FIG. 17B, a pixel circuit may be disposed on the second surface 112 remaining after the polishing process is performed. As described above, the pixel circuit may include a plurality of elements, interconnection patterns 170 connected to the plurality of elements, and an insulating layer 180 covering the plurality of elements and the interconnection patterns 170. The pixel circuit may be formed to control an operation of the image sensor 100-1.

Portions of the substrate 110 and the device isolation layer DTI, opposing the second surface 112 of the substrate 110, may be removed by a polishing process. Thus, an internal structure and a pixel circuit of the substrate 110 included in the image sensor 100-1 may be formed.

An upper surface of the substrate 110, opposing the substrate 110 remaining after being removed in the polishing process, may be defined as a first surface 111.

Figure 17C:
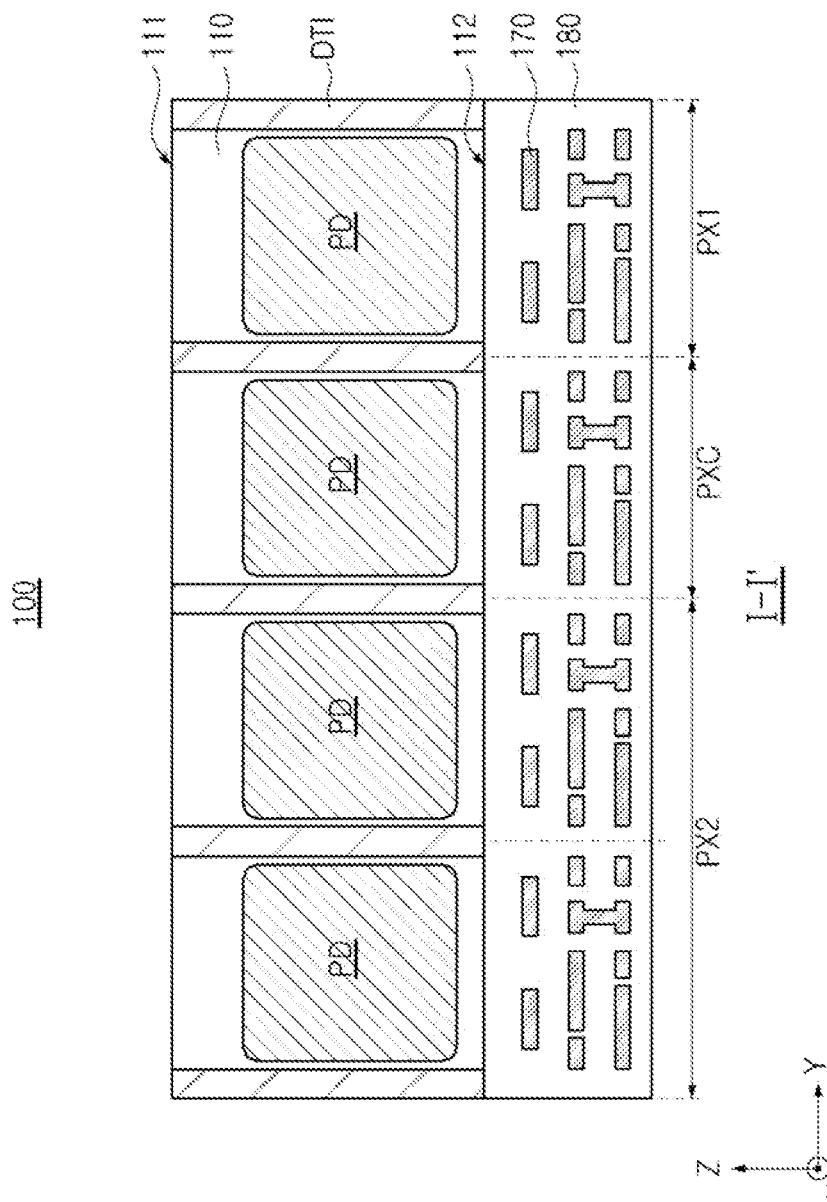

Referring to FIG. 17C, the device isolation layer DTI included in the image sensor 100-1 may penetrate through the second surface 112 and the first surface 111 of the substrate 110. However, this may be varied, e.g., among the device isolation layers DTI, one or more device isolation layers DTI may be formed to have different lengths.

The operations illustrated in FIGS. 17D to 17F may be operations of forming the upper structure of the unit pixel PX included in the image sensor 100-1 described with reference to FIG. 4.

Figure 17D:
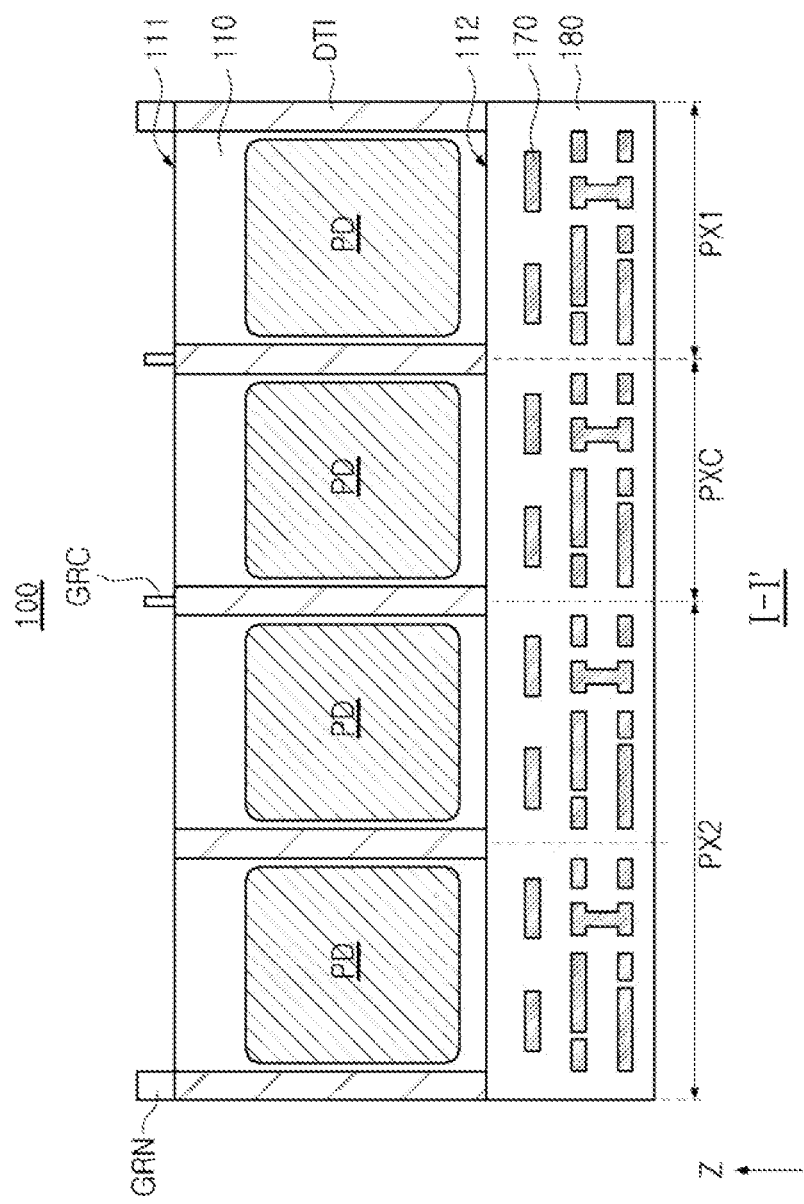
Figure 17E:
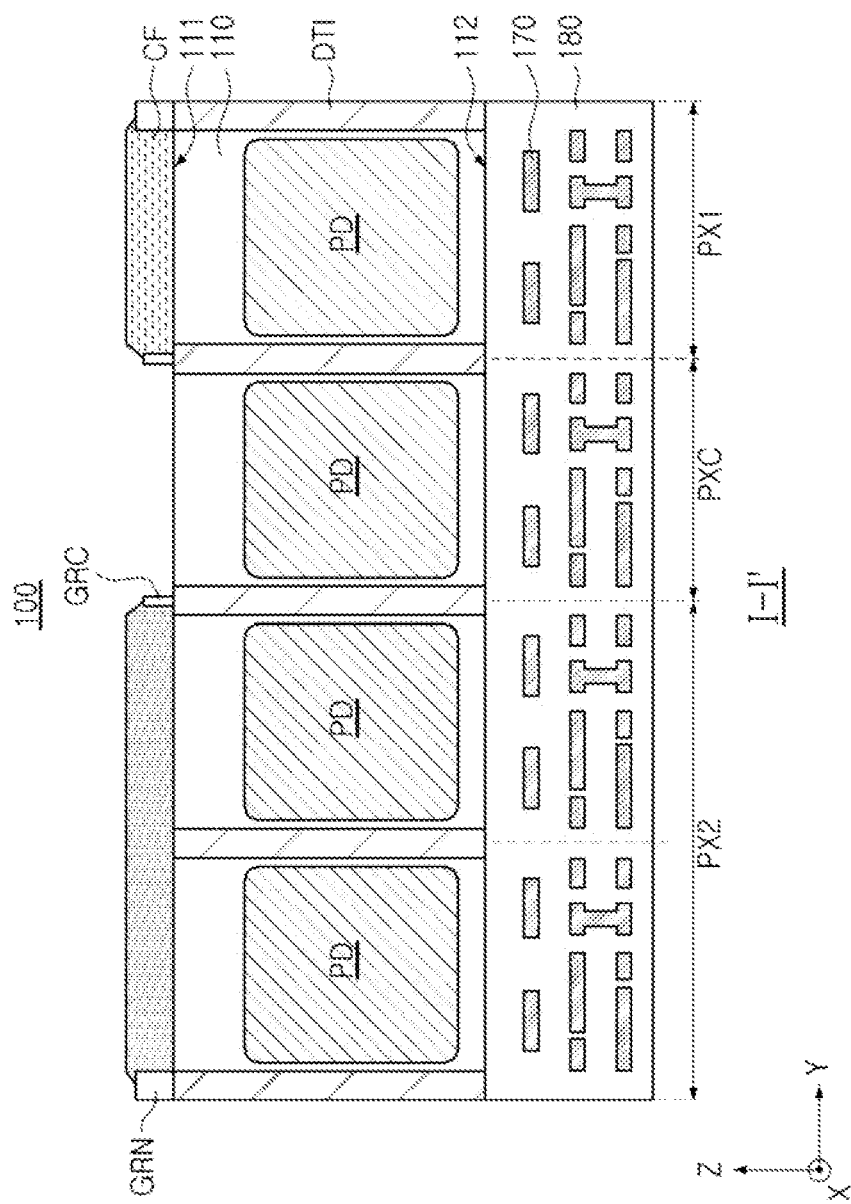
Figure 17F:
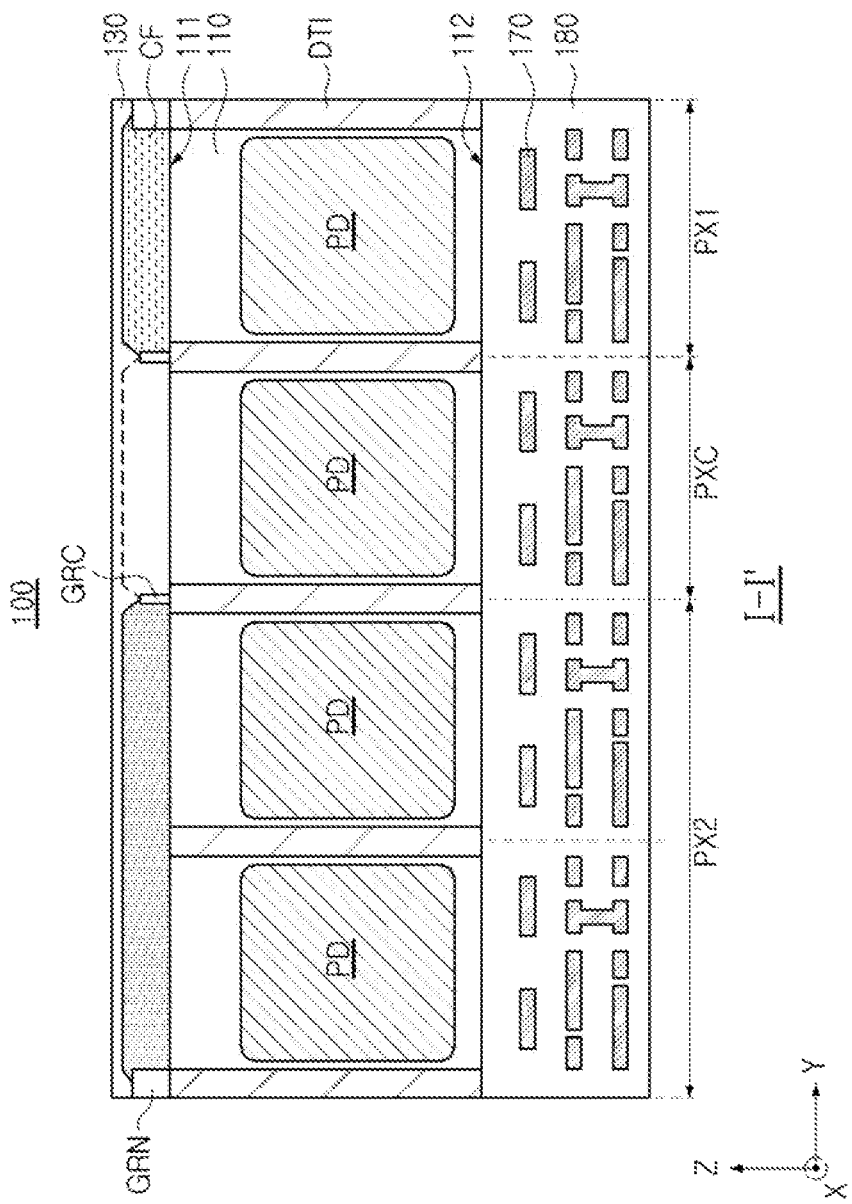

Referring to FIGS. 17D to 17F, a normal grid GRN and a compensation grid GRC may be formed on the device isolation layer DTI on the second surface 112 of the substrate 110, a color filter CF may be formed on the grid GR and the second surface 112, and a light transmitting layer 130 may be deposited on an upper surface of the resultant structure.

Subsequently (not shown in FIGS. 17D to 17F), microlenses ML having various sizes allowing light to be incident may be deposited on an outermost side of the unit pixel PX, and may be provided as the image sensor 100-1 illustrated in FIG. 3A.

The manufacturing process may be varied depending on the configuration and effect of the image sensor 100-1.

Figure 18:
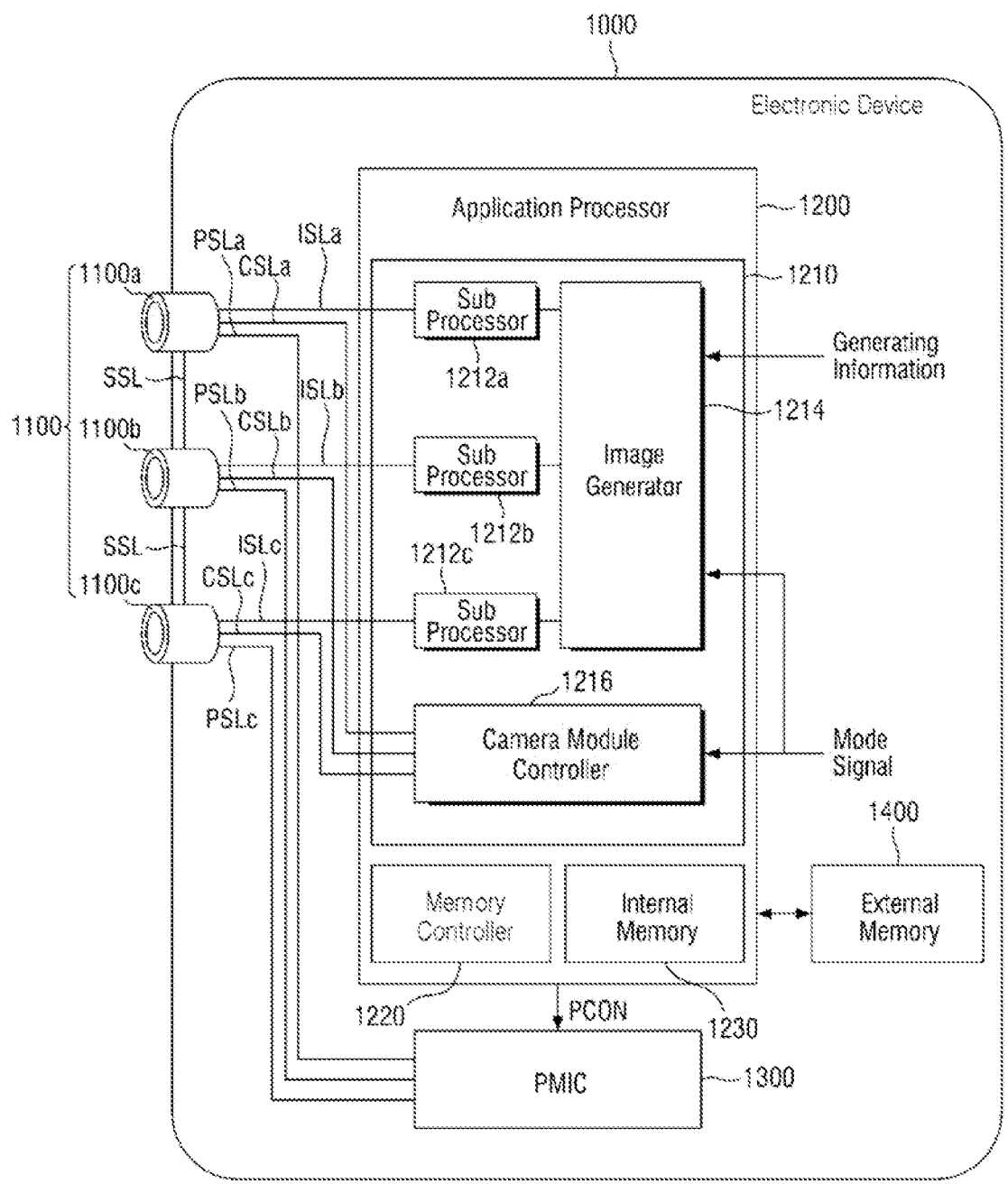
FIGS. 18 and 19 are schematic diagrams of an electronic device including an image sensor according to an example embodiment.
Figure 19:
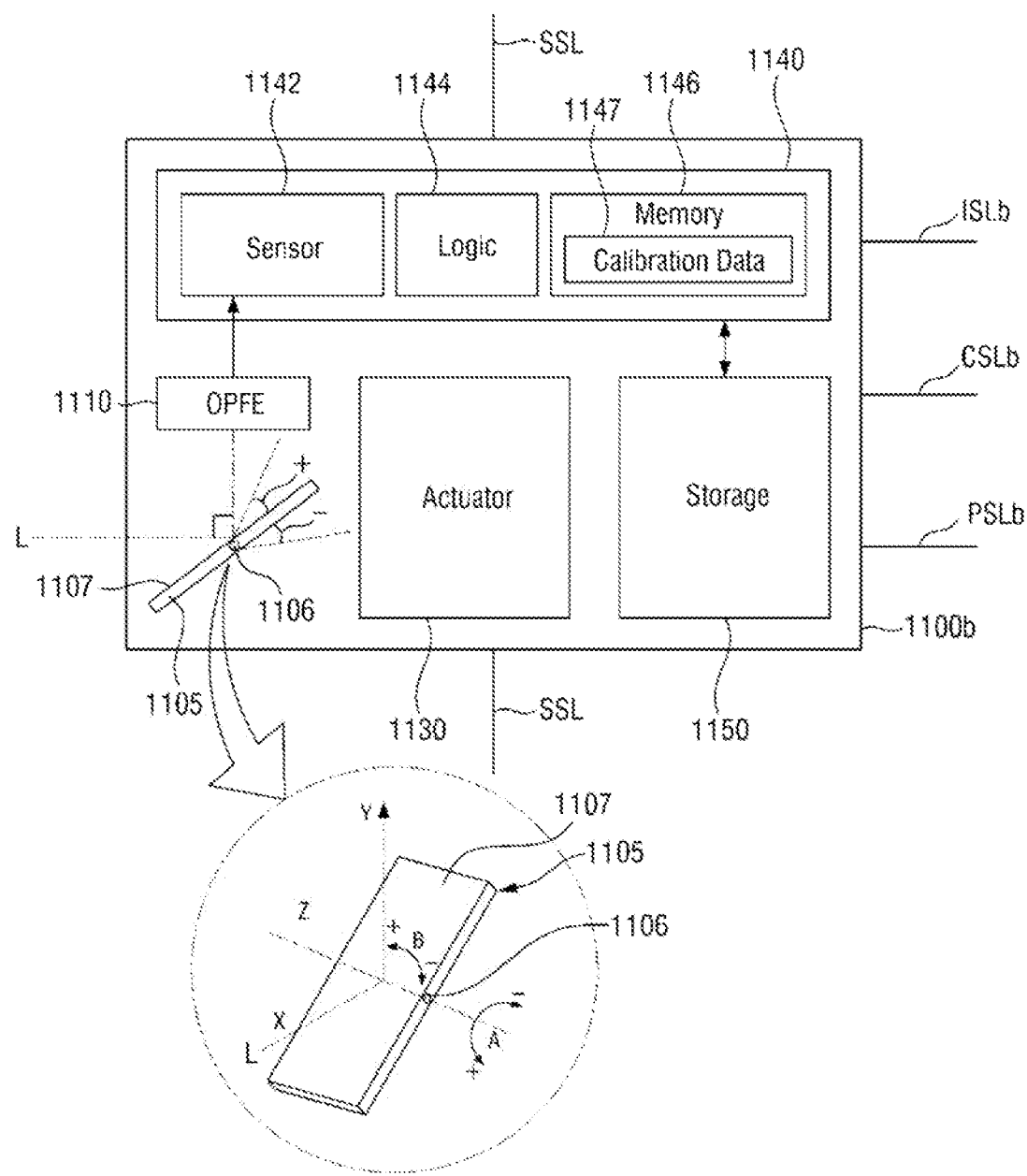

FIGS. 18 and 19 are schematic diagrams of an electronic device including an image sensor according to an example embodiment.

Referring to FIG. 18, an electronic device 1000 may include a camera module group 1100, an application processor 1200, a power management integrated circuit (PMIC) 1300, and an external memory 1400.

The camera module group 1100 may include a plurality of camera modules 1100a, 1100b, and 1100c. Although three camera modules 1100a, 1100b, and 1100c are illustrated as an example in FIG. 19, the camera module group 1100 may be modified to include only two camera modules, or may be modified to include n camera modules (where n is a positive integer of 4 or more).

At least one of the plurality of camera modules 1100a, 1100b, and 1100c included in the camera module group 1100 may include an image sensor according to one of the example embodiments described above with reference to FIGS. 1 to 17F.

Hereinafter, a detailed configuration of the camera module 1100b will be described with reference to FIG. 19, but the following description will be equally applied to the other camera modules 1100a and 1100c according to example embodiments.

Referring to FIG. 19, the camera module 1100b may include a prism 1105, an optical path folding element (hereinafter referred to as "OPFE") 1110, an actuator 1130, an image sensing device 1140, and a storage 150.

The prism 1105 may include a reflective surface 1107 of a light reflecting material to change a path of externally incident light L.

The prism 1105 may change a path of light L, incident in an X direction, to an Y direction perpendicular to the X direction. The prism 1105 may rotate the reflective surface 1107 of the optical reflecting material about a central axis 1106 or may rotate the central axis 1106 in a direction "B" to change a path of the light incident in the X direction to the Y direction, a vertical direction. The OPFE 1110 may be moved in a Z direction perpendicular to the X direction and the Y direction.

A maximum rotation angle of the prism 1105 in a direction "A" may be 15 degrees or less in a positive direction "A" and more than 15 degrees in a negative direction "A," as an example.

The prism 1105 may be moved at an angle of around 20 degrees, 10 degrees to 20 degrees, or 15 degrees to 20 degrees in a positive or negative direction "B." The prism 1105 may be moved at the same angle in the positive or negative direction "B," or may be moved at a nearly similar at an angle of around 1 degree.

The prism 1105 may move the reflective surface 1107 of the light reflective material in a Z- direction, parallel to a direction in which the central axis 1106 extends.

The OPFE 1110 may include an optical lens including, e.g., m groups (where m is a positive integer). The m lenses may be moved in a third direction to change an optical zoom ratio of the camera module 1100b. For example, if a basic optical zoom magnification of the camera module 1100b is set to Z, when m optical lenses included in the OPFE 1110 are moved, the optical zoom magnification of the camera module 1100b may be changed to an optical zoom magnification of 3Z, 5Z, or more.

The actuator 1130 may move the OPFE 1110 or an optical lens (hereinafter, referred to as an optical lens) to a specific position. For example, the actuator 1130 may adjust a position of the optical lens such that the sensor 1142 is disposed at a focal length of the optical lens to achieve accurate sensing. For example, the sensor 1142 may be an image sensor.

The image sensing device 1140 may include a sensor 1142, a control logic 1144, and a memory 1146. The sensor 1142 may sense an image of a sensing object using light L provided through an optical lens. The control logic 1144 may control the overall operation of the camera module 1100b. For example, the control logic 1144 may control an operation of the camera module 1100b in response to a control signal provided through a control signal line CSLb.

The memory 1146 may store information that is used for the operation of the camera module 1100b, such as calibration data 1147. The calibration data 1147 may include information used to generate image data using light L provided externally by the camera module 1100b. The calibration data 1147 may include, e.g., information on a degree of rotation, information on a focal length, and information on an optical axis, described above. When the camera module 1100b is implemented in the form of a multi-state camera having a focal length varying depending on a position of an optical lens, the calibration data 1147 may include a position-dependent (or state-dependent) focal length value of the optical lens and autofocusing-related information.

The storage 1150 may store image data sensed by the sensor 1142. The storage 1150 may be disposed outside the image sensing device 1140, and may be implemented in the form of being stacked with a sensor chip constituting the image sensing device 1140. The storage 1150 may be implemented as an electrically erasable programmable read-only memory (EEPROM), as an example.

Referring to FIGS. 18 and 19 together, each of the plurality of camera modules 1100a, 1100b, and 1100c may include an actuator 1130. Accordingly, each of the plurality of camera modules 1100a, 1100b, and 1100c may include the same or different calibration data 1147 based on the operation of the actuator 1130 included therein.

Among the plurality of camera modules 1100a, 1100b, and 1100c, one camera module (for example, 1100b) may be a folded-lens type camera module including a prism 1105 and an OPFE 1110 described above, and each of the other cameras (for example, 1100a and 1100c) may be a vertical type camera module which does not include the prism 1105 and the OPFE 1110.

Among the plurality of camera modules 1100a, 1100b, and 1100c, one camera module (for example, 1100c) may be, e.g., a vertical type depth camera extracting depth information using infrared rays (IR). In this case, an application processor 1200 may merge image data, provided from such a depth camera, and image data, provided from another camera module (for example, 1100a or 1100b), to generate a three-dimensional (3D) depth image.

Among the plurality of camera modules 1100a, 1100b, and 1100c, at least two camera modules (for example, 1100a and 1100b) may have different fields of view. In this case, e.g., optical lenses of at least two camera modules (for example, 1100a and 1100b), among the plurality of camera modules 1100a, 1100b, and 1100c, may be different from each other.

Fields of view of the plurality of camera modules 1100a, 1100b, and 1100c may be different from each other. In this case, the optical lenses included in the plurality of camera modules 1100a, 1100b, and 1100c may also be different from each other.

The plurality of camera modules 1100a, 1100b, and 1100c may be disposed to be physically separated from each other, such that the plurality of camera modules 1100a, 1100b, and 1100c do not use a sensing region of a single sensor 1142 after dividing the sensing region, but an independent sensor 1142 may be disposed inside each of the plurality of camera modules 1100a, 1100b, and 1100c.

Returning to FIG. 18, the application processor 1200 may include an image processing device 1210, a memory controller 1220, and an internal memory 1230. The application processor 1200 may be implemented by being separated from the plurality of camera modules 1100a, 1100b, and 1100c. For example, the application processor 1200 and the plurality of camera modules 1100a, 1100b, and 1100c may be implemented by being separated from each other using an additional semiconductor chip.

The image processing device 1210 may include a plurality of sub-processors 1212a, 1212b, and 1212c, an image generator 1214, and a camera module controller 1216. The number of the plurality of the sub-processors 1212a, 1212b, and 1212c may correspond to the number of the plurality of camera modules 1100a, 1100b, and 1100c.

Image data, generated by the camera modules 1100a, 1100b, and 1100c, may be provided to the corresponding sub-processors 1212a, 1212b, and 1212c through separated image signal lines ISLa, ISLb, and ISLc. For example, image data generated by the camera module 1100a may be provided to the sub-processor 1212a through an image signal line ISLa, and image data generated by the camera module 1100b may be provided to the sub-processor 1212b through the image signal line ISLb, and image data generated by the camera module 1100c may be provided to the sub-processor 1212c through the image signal line ISLc.

Image data transmission may be performed using, e.g., a camera serial interface (CSI) based on a mobile industry processor interface (MIPI).

A single sub-processor may be arranged to correspond to a plurality of camera modules. For example, the sub-processor 1212a and the sub-processor 1212c may be implemented not by being separated from each other as illustrated, but by being integrated into a single sub-processor, and image data provided from the camera module 1100a and the camera module 1100c may be selected through a select element (e.g., a multiplexer), or the like, and then provided to the integrated sub-processor.

The image data provided to each of the sub-processors 1212a, 1212b, and 1212c may be provided to the image generator 1214. The image generator 1214 may generate an output image using image data, provided from each of the sub-processors 1212a, 1212b, and 1212c, based on image generating information or a mode signal.

The image generator 1214 may merge at least a portion of the image data, generated by the camera modules 1100a, 1100b, and 1100c having different fields of view based on the image generating information or the mode signal, to generate an output image. Also, the image generator 1214 may select one of the image data, generated by the camera modules 1100a, 1100b, and 1100c having different fields of view based on the image generation information or the mode signal, to generate an output image.

The image generating information may include a zoom signal or a zoom factor. In some embodiments, the mode signal may be, e.g., a signal based on a mode selected from a user.

When the image generating information is a zoom signal (a zoom factor) and the camera modules 1100a, 1100b, and 1100c have different fields of view, the image generator 1214 may perform different operations depending on the type of the zoom signal. For example, when the zoom signal is a first signal, the image generator 1214 may merge image data output from the camera module 1100a and the image data output from the camera module 1100c and may then output an output image using a merged image signal and image data output from the camera module 1100b not used for the merging. When the zoom signal is a second signal different from the first signal, the image generator 1214 may not perform such an image data merging operation and may select one of the image data, output from the camera modules 1100a, 1100b, and 1100c, to generate an output image.

The image generator 1214 may receive a plurality of pieces of image data having different exposure times from at least one of the plurality of sub-processors 1212a, 1212b, and 1212c, and may perform high dynamic range (HDR) processing on the plurality of pieces of image data to generate merged image data having an increased dynamic range.

The camera module controller 1216 may provide a control signal to each of the camera modules 1100a, 1100b, and 1100c. The control signals, generated by the camera module controller 1216, may be provided to the corresponding camera modules 1100a, 1100b, and 1100c through separated control signal lines CSLa, CSLb, and CSLc, respectively.

One of the plurality of camera modules 1100a, 1100b, and 1100c may be designated as a master camera (for example, 1100b) based on the image generating information or a mode signal including a zoom signal, and the other camera modules (for example, 1100a and 1100c) may be designated as slave cameras. Such information may be included in the control signal and provided to the corresponding camera modules 1100a, 1100b, and 1100c through the separated control signal lines CSLa, CSLb, and CSLc.

A camera module, operating as a master camera and a slave camera, may vary depending on a zoom factor or an operating mode signal. For example, when a field of view of the camera module 1100a is wider than a field of view of the camera module 1100b and the zoom factor represents a low zoom magnification, the camera module 1100b may operate as a master camera and the camera module 1100a may operate as a slave camera. Conversely, when the zoom factor represents a high zoom magnification, the camera module 1100a may operate as a master camera and the camera module 1100b may operate as a slave camera.

The control signal provided from the camera module controller 1216 to each of the camera modules 1100a, 1100b, and 1100c may include a synchronization enable signal. For example, when the camera module 1100b is a master camera and the camera modules 1100a and 1100c are slave cameras, the camera module controller 1216 may transmit the synchronization enable signal to the camera module 1100b. The camera module 1100b, receiving the synchronization enable signal, may generate a synchronization signal based on the received synchronization enable signal, and may transmit the generated synchronization signal to the camera modules 1100a and 1100c. The camera module 1100b and the camera modules 1100a and 1100c may transmit image data to the application processor 1200 in synchronization with the synchronization signal.

The control signal provided from the camera module controller 1216 to the plurality of camera modules 1100a, 1100b, and 1100c may include mode information on the mode signal. The plurality of camera modules 1100a, 1100b, and 1100c may operate in a first operating mode and a second operating mode, based on the mode information, in relation to a sensing speed.

The plurality of camera modules 1100a, 1100b, and 1100c may generate an image signal at a first speed (for example, generate an image signal at a first frame rate) in a first operating mode, may encode the generated image signal at a second speed higher than the first speed (for example, encode the generated image signal at a second frame rate higher than the first frame rate), and may transmit the encoded image signal to the application processor 1200. In this case, the second speed may be 30 times or less of the first speed.

The application processor 1200 may store the received image signal, e.g., the encoded image signal, in the internal memory 1230 provided therein or the external memory 1400 outside the application processor 1200, and then may read and decode the encoded image signal from the internal memory 1230 or the external memory 1400 and may display image data generated based on the decoded image signal. For example, among the plurality of sub-processors 1212a, 1212b, and 1212c of the image processing device 1210, a corresponding sub-processor may perform a decoding process and may also perform an image processing operation on the decoded image signal.

The plurality of camera modules 1100a, 1100b, and 1100c may generate an image signal at a third rate lower than the first rate (for example, generate an image signal at a third frame rate lower than the first frame rate) in the second operating mode, and may transmit the generated image signal to the application processor 1200. The image signal provided to the application processor 1200 may be an unencoded signal. The application processor 1200 may perform image processing on the received image signal or may store the image signal in the internal memory 1230 or the external memory 1400.

The PMIC 1300 may supply power, e.g., a power supply voltage, to each of the plurality of camera modules 1100a, 1100b, and 1100c. For example, the PMIC 1300 may supply first power to the camera module 1100a through a power signal line PSLa, may supply second power to the camera module 1100b through a power signal line PSLb, and may supply third power to the camera module 1100c through a power signal line PSLc, under the control of the application processor 1200.

The PMIC 1300 may generate power corresponding to each of the plurality of camera modules 1100a, 1100b, and 1100c in response to a power control signal PCON from the application processor 1200, and may also adjust a level of the power. The power control signal PCON may include a power adjustment signal for each operating mode of the plurality of camera modules 1100a, 1100b, and 1100c. For example, the operating mode may include a low power mode. In this case, the power control signal PCON may include information on a camera module operating in the low power mode and a set power level. Levels of the powers, respectively supplied to the plurality of camera modules 1100a, 1100b, and 1100c, may be the same or different from each other. Also, the levels of the powers may be dynamically changed.

As described above, an image sensor according to an example embodiment may include a microlens and a grid formed to be small in a compensation pixel adjacent to an autofocusing pixel and including a transparent color filter. Accordingly, crosstalk in the autofocusing pixel may be prevented, and sensitivity in the compensation pixel may be improved.

An image sensor according to an example embodiment may include a pixel including a microlens and a grid formed to be smaller in a direction toward an edge of a pixel array from a center of the pixel array. Accordingly, a crosstalk issue and a lens shading issue may be addressed.

Example embodiments may provide an image sensor which may prevent crosstalk from occurring in an autofocusing pixel of an image sensor including a transparent color filter, may improve sensitivity of a pixel adjacent to the autofocusing pixel, and may generate images having improved image quality.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:
    a substrate, having a first surface and a second surface opposing each other in a first direction, on which a plurality of unit pixels are arranged, the plurality of unit pixels including at least one normal pixel, at least one autofocusing pixel, and at least one compensation pixel arranged parallel to the first surface;
    a photodiode disposed in the substrate in each of the plurality of unit pixels; and
    a device isolation layer disposed between the plurality of unit pixels, wherein:
    the plurality of unit pixels includes color filters, disposed on the first surface and separated from each other by a grid, a light transmitting layer having a planar top surface and disposed on the color filters, and microlenses disposed on the planar top surface of the light transmitting layer and above the color filters,
    the normal pixel includes a normal microlens, and
    the compensation pixel is disposed on one side of the autofocusing pixel and includes a transparent color filter and a compensation microlens, which is smaller than the normal microlens.

2. The image sensor as claimed in claim 1, wherein the autofocusing pixel includes a pair of unit pixels disposed side by side in a second direction, perpendicular to the first direction, and sharing an autofocusing microlens.

3. The image sensor as claimed in claim 2, wherein the pair of unit pixels included in the autofocusing pixel include chromatic color filters having a same color.

4. The image sensor as claimed in claim 2, wherein the compensation pixel is disposed on one side of the autofocusing pixel in the second direction.

5. The image sensor as claimed in claim 4, wherein a pixel disposed on the other side of the autofocusing pixel in the second direction is the normal pixel including a chromatic color filter.

6. The image sensor as claimed in claim 1, wherein the grid includes a metal or a transparent material.

7. The image sensor as claimed in claim 1, wherein:
the normal pixel includes a normal grid, and
the transparent color filter included in the compensation pixel is separated from adjacent color filters by a compensation grid, which is smaller than the normal grid.

8. The image sensor as claimed in claim 7, wherein a length of a color filter included in the normal pixel is smaller, in a second direction perpendicular to the first direction, than a length of a color filter included in the compensation pixel.

9. An image sensor, comprising:
a substrate;
a pixel array including a plurality of pixel groups arranged parallel to an upper surface of the substrate; and
a logic circuit configured to obtain pixel signals from the pixel array, wherein:
each of the plurality of pixel groups includes a plurality of unit pixels forming at least one of an autofocusing pixel, a compensation pixel, and a normal pixel, which are respectively defined by a device isolation layer extending in a first direction, perpendicular to the upper surface of the substrate,
each unit pixel includes:
a photodiode disposed in the substrate;
a color filter disposed on the upper surface of the substrate and separated from an adjacent color filter by a grid;
a light transmitting layer having a planar top surface and disposed on the color filter; and
a microlens disposed on the planar top surface of the light transmitting layer and above the color filter,
the autofocusing pixel includes a pair of unit pixels, and
the compensation pixel is configured to compensate for a signal output from the autofocusing pixel, and includes a compensation microlens, smaller than the microlens included in adjacent pixels, and a transparent color filter.

10. The image sensor as claimed in claim 9, wherein unit pixels included in the autofocusing pixel are disposed side by side in a second direction, perpendicular to the first direction, and include chromatic color filters having a same color.

11. The image sensor as claimed in claim 9, wherein:
each of the plurality of pixel groups includes unit pixels arranged in a 2-by-2 array,
the plurality of pixel groups includes a first pixel group, which includes only the normal pixel and the compensation pixel,
the first pixel group includes two transparent color filters, not adjacent to each other, and
the first pixel group includes two chromatic color filters, not adjacent to each other.

12. The image sensor as claimed in claim 9, wherein the microlenses and the grid are smaller in a direction toward an edge of the pixel array.

13. The image sensor as claimed in claim 12, wherein:
unit pixels included in the autofocusing pixel are disposed side by side in a second direction, perpendicular to the first direction, and
the compensation pixel is disposed on one side of the autofocusing pixel in the second direction.

14. The image sensor as claimed in claim 12, wherein a distance between a central axis of each of the plurality of unit pixels and an optical axis of the microlens included in each of the plurality of unit pixels is increased in a direction toward the edge of the pixel array.

15. The image sensor as claimed in claim 9, wherein the compensation pixel includes a compensation grid that is smaller than the grid included in pixels adjacent to the compensation pixel.

16. The image sensor as claimed in claim 9, wherein a length of the grid in a second direction, perpendicular to the first direction, and a third direction, perpendicular to the second direction, corresponds to a size of the microlens having a smaller size, among microlenses respectively corresponding to the color filters separated by the grid.

17. The image sensor as claimed in claim 9, wherein the pair of unit pixels included in the autofocusing pixel spans two adjacent pixel groups.

18. An image sensor, comprising:
a substrate, having a first surface and a second surface opposing each other in a first direction;
unit pixels on the first surface;
a photodiode in the substrate in each of the unit pixels;
a device isolation layer between the unit pixels, the unit pixels form an autofocusing pixel, a normal pixel, and a compensation pixel, each unit pixel has a color filter, which is separated from an adjacent color filter by a grid, and a microlens on the color filter; and
a light transmitting layer having a planar top surface and disposed on the color filters, wherein:
the autofocusing pixel includes a pair of unit pixels disposed side by side in a second direction and sharing a microlens and a color filter,
the microlens disposed on the planar top surface of the light transmitting layer and above the color filter, and
the compensation pixel is configured to compensate for a signal output from the autofocusing pixel, has a structure different from a structure of the normal pixel, is disposed on one side of the autofocusing pixel in the second direction, and includes a transparent color filter.

19. The image sensor as claimed in claim 18, wherein the compensation pixel includes a compensation microlens that is smaller than a normal microlens included in the normal pixel.

20. The image sensor as claimed in claim 18, wherein the compensation pixel includes a compensation grid having a length that is shorter than a length of a normal grid included in the normal pixel in the second direction and a third direction, perpendicular to the second direction.

* * * * *